(12) United States Patent
Oda

(10) Patent No.: US 9,966,452 B2
(45) Date of Patent: May 8, 2018

(54) SEMICONDUCTOR DEVICE HAVING A FIELD EFFECT TRANSISTOR FORMED ON A SILICON-ON-INSULATOR SUBSTRATE AND MANUFACTURING METHOD THEREOF

(71) Applicant: Renesas Electronics Corporation, Koutou-ku, Tokyo (JP)

(72) Inventor: Hidekazu Oda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 14/864,781

(22) Filed: Sep. 24, 2015

(65) Prior Publication Data
US 2016/0087069 A1  Mar. 24, 2016

(30) Foreign Application Priority Data

Sep. 24, 2014  (JP) .................................. 2014-193986

(51) Int. Cl.
| | |
|---|---|
| *H01L 29/786* | (2006.01) |
| *H01L 27/088* | (2006.01) |
| *H01L 29/66* | (2006.01) |
| *H01L 29/36* | (2006.01) |
| *H01L 29/16* | (2006.01) |

(Continued)

(52) U.S. Cl.
CPC .. *H01L 29/66068* (2013.01); *H01L 21/26513* (2013.01); *H01L 21/324* (2013.01); *H01L 21/76251* (2013.01); *H01L 21/84* (2013.01); *H01L 27/088* (2013.01); *H01L 27/1203* (2013.01); *H01L 27/1207* (2013.01); *H01L 29/0649* (2013.01); *H01L 29/167* (2013.01);

*H01L 29/1608* (2013.01); *H01L 29/36* (2013.01); *H01L 29/78* (2013.01); *H01L 29/78606* (2013.01); *H01L 29/78648* (2013.01);
(Continued)

(58) Field of Classification Search
CPC ............... H01L 29/165; H01L 29/1608; H01L 27/1207
See application file for complete search history.

(56) References Cited

U.S. PATENT DOCUMENTS 8,748,986 B1 * 6/2014 Shifren ................. H01L 29/786
257/348
2006/0022270 A1  2/2006 Boyd et al.
(Continued)

FOREIGN PATENT DOCUMENTS

| CN | 103 377 930 A | 10/2013 |
|---|---|---|
| JP | 2004-349315 A | 12/2004 |

(Continued)

OTHER PUBLICATIONS

Extended European search report for European Patent Application No. 15186471.7, dated Feb. 22, 2016.

*Primary Examiner* — Daniel Luke
(74) *Attorney, Agent, or Firm* — Shapiro, Gabor and Rosenberger, PLLC

(57) ABSTRACT

A semiconductor device includes an SOI substrate and a MISFET formed on the SOI substrate. The SOI substrate has a base substrate, a ground plane region formed on the base substrate, a BOX layer formed on the ground plane region and an SOI layer formed on the BOX layer. The base substrate is made of silicon and the ground plane region includes a semiconductor region made of silicon carbide.

19 Claims, 25 Drawing Sheets

(51) Int. Cl.
  *H01L 29/06* (2006.01)
  *H01L 21/324* (2006.01)
  *H01L 21/265* (2006.01)
  *H01L 29/167* (2006.01)
  *H01L 29/78* (2006.01)
  *H01L 21/762* (2006.01)
  *H01L 27/12* (2006.01)
  *H01L 21/84* (2006.01)

(52) U.S. Cl.
  CPC .. *H01L 29/78654* (2013.01); *H01L 29/78687* (2013.01)

(56) References Cited

U.S. PATENT DOCUMENTS

| | | |
|---|---|---|
| 2007/0164356 A1 | 7/2007 | Adam et al. |
| 2011/0284870 A1* | 11/2011 | Le Tiec ............... H01L 29/1608 257/77 |
| 2012/0112207 A1 | 5/2012 | Cheng et al. |
| 2012/0168863 A1* | 7/2012 | Zhu .................... H01L 21/84 257/347 |
| 2013/0175594 A1 | 7/2013 | Basker et al. |
| 2014/0203364 A1 | 7/2014 | Tsunomura et al. |
| 2015/0076602 A1 | 3/2015 | Zhu et al. |
| 2015/0145046 A1* | 5/2015 | Yin ................... H01L 29/66772 257/349 |

FOREIGN PATENT DOCUMENTS

| | | |
|---|---|---|
| JP | 2013-191760 A | 9/2013 |
| WO | WO 2011/041109 A1 | 4/2011 |

* cited by examiner

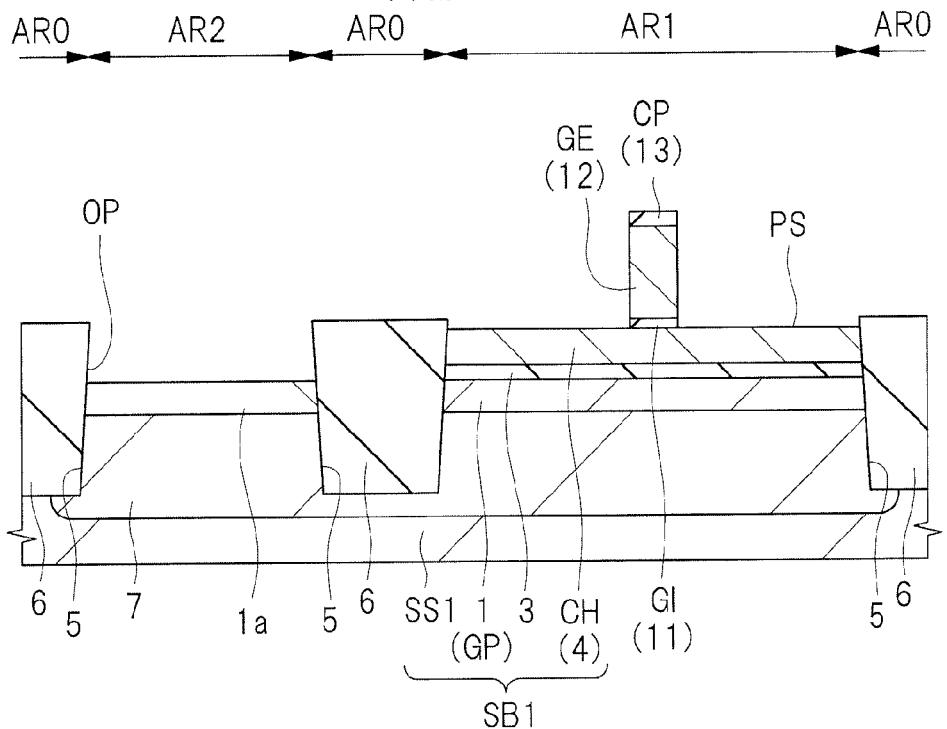
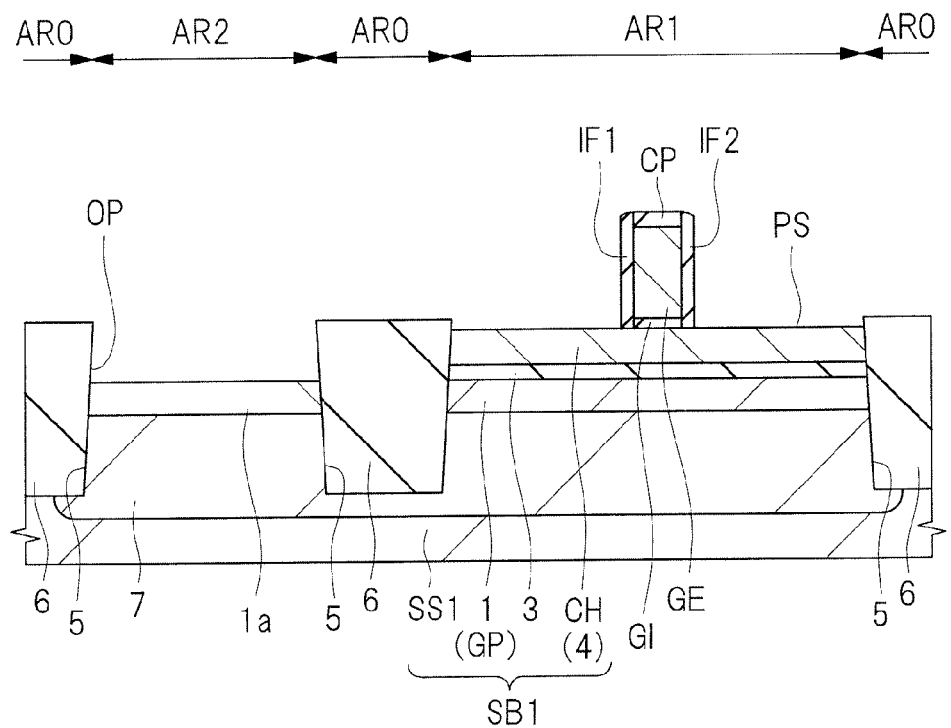

SS1(SB2)

SS1(SB2)

SEMICONDUCTOR DEVICE HAVING A FIELD EFFECT TRANSISTOR FORMED ON A SILICON-ON-INSULATOR SUBSTRATE AND MANUFACTURING METHOD THEREOF

CROSS-REFERENCE TO RELATED APPLICATION

The present application claims priority from Japanese Patent Application No. 2014-193986 filed on Sep. 24, 2014, the content of which is hereby incorporated by reference into this application.

TECHNICAL FIELD OF THE INVENTION

The present invention relates to a semiconductor device and a manufacturing method thereof, and it can be effectively applied to, for example, a semiconductor device provided with semiconductor elements formed on an SOI (Silicon On Insulator) substrate and a manufacturing method thereof.

BACKGROUND OF THE INVENTION

With the increase in integration degree of semiconductor devices, field effect transistors such as MISFET (Metal Insulator Semiconductor Field Effect Transistor) are miniaturized in accordance with the scaling law. However, with the miniaturization of the field effect transistors, the short-channel effect appears or the uniformity in threshold voltage is degraded, so that the performance of the semiconductor device is likely to be degraded.

On the other hand, in the MISFET on an SOI substrate in which a BOX (Buried Oxide) layer that is a buried oxide film and an SOI (Silicon On Insulator) layer that is a semiconductor layer are formed on a bulk substrate, the short-channel effect can be easily suppressed and the variations in threshold voltage can be reduced in comparison with the MISFET on a bulk substrate, and the performance of the semiconductor device can be enhanced. For this reason, the MISFET on an SOI substrate is regarded as a technology necessary for realizing the semiconductor device in the generation of the circuit line width of 40 nm or less and the low-power semiconductor device.

Japanese Patent Application Laid-Open Publication No. 2013-191760 (Patent document 1) discloses a technique of forming a field effect transistor on a main surface of a semiconductor substrate made up of a silicon substrate, a BOX layer and an SOI layer in a semiconductor device.

Japanese Patent Application Laid-Open Publication No. 2004-349315 (Patent document 2) discloses a technique of fabricating a strained SOI substrate wafer, in which an oxide film layer, an SiC epitaxial layer and a silicon layer having a lattice strain are sequentially formed on a silicon substrate, by the bond and etch-back method.

SUMMARY OF THE INVENTION

A semiconductor device provided with an FD-SOI (Fully Depleted Silicon On Insulator) MISFET formed by using the SOTB (Silicon On Thin Buried oxide) technology as the MISFET on the SOI substrate mentioned above has been known. In such an FD-SOI MISFET, an SOI layer located below a gate electrode is a channel having a sufficiently low impurity concentration or a channel to which no impurity is introduced, that is, a dopant-free channel.

When the MISFET is an SOI MISFET having a dopant-free channel, the threshold voltage can be adjusted by a work function of a gate electrode, or can be adjusted by a built-in potential of a ground plane region corresponding to a back gate provided in a base substrate below a BOX layer.

However, when a polycrystalline silicon film is used as a conductive film included in a gate electrode, since a work function of the conductive film is affected by the conditions of ion implantation in forming source/drain regions, it is difficult to freely adjust the work function of the conductive film. Therefore, the adjustment of the threshold voltage is desirably made by adjusting the built-in potential by the ion implantation amount in forming the ground plane region.

Meanwhile, when the ion implantation is performed to the ground plane region and then the activation annealing is performed, the ion-implanted impurities are likely to be diffused. Therefore, after the activation annealing is performed, the average value of impurity concentration in the entire ground plane region decreases. Consequently, since the absolute value of the built-in potential of the ground plane region decreases, the range capable of adjusting the threshold voltage is narrowed and the performance of the semiconductor device is degraded.

The other problems and novel characteristics will be apparent from the description of the present specification and the accompanying drawings.

According to an embodiment, a semiconductor device includes an SOI substrate and a MISFET formed on the SOI substrate. The SOI substrate has a base substrate, a ground plane region formed on the base substrate, a BOX layer formed on the ground plane region and an SOI layer formed on the BOX layer. The base substrate is made of silicon and the ground plane region includes a p-type semiconductor region made of SiC.

Also, according to another embodiment, a manufacturing method of a semiconductor device includes: a step of preparing an SOI substrate; and a step of forming a MISFET on the SOI substrate. In the step of preparing the SOI substrate, the SOI substrate having a base substrate, a semiconductor region formed on the base substrate, a BOX layer formed on the semiconductor region and an SOI layer formed on the BOX layer is prepared. The base substrate is made of silicon and the semiconductor region is made of SiC. In the step of forming the MISFET on the SOI substrate, an impurity is introduced to the semiconductor region.

According to an embodiment of the present invention, it is possible to improve the performance of the semiconductor device.

BRIEF DESCRIPTIONS OF THE DRAWINGS

FIG. 14 is a cross-sectional view showing a principal part in the manufacturing process of the semiconductor device of the first embodiment;

FIG. 15 is a cross-sectional view showing a principal part in the manufacturing process of the semiconductor device of the first embodiment;

DESCRIPTIONS OF THE PREFERRED EMBODIMENTS

Figure 1:
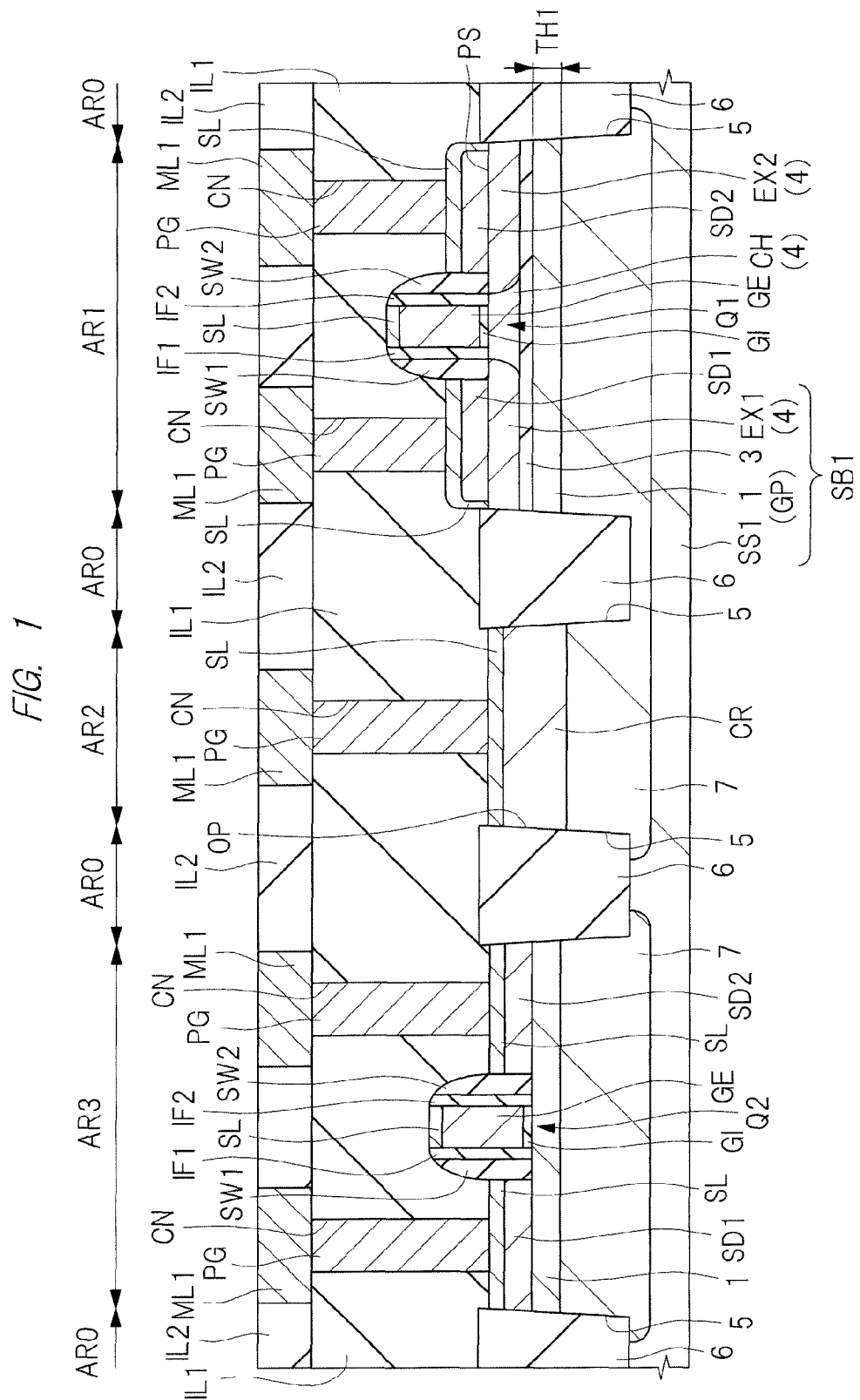
FIG. 1 is a cross-sectional view showing a principal part of a semiconductor device of the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modified example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, typical embodiments of the present invention will be described in detail with reference to the accompanying drawings. Note that components having the same function are denoted by the same reference characters throughout the drawings for describing the embodiments, and the repetitive description thereof will be omitted. Also, the description of the same or similar parts is not repeated in principle unless particularly required in the following embodiments.

Furthermore, in the drawings used in the following embodiments, hatching is sometimes omitted even in a cross-sectional view so as to make the drawings easy to see.

First Embodiment

Structure of Semiconductor Device

First, a semiconductor device of the first embodiment will be described with reference to drawings. FIG. 1 is a cross-sectional view showing a principal part of a semiconductor device of the first embodiment.

As shown in FIG. 1, the semiconductor device of the first embodiment includes an SOI substrate SB1 as a semiconductor substrate and a MISFET Q1 as a field effect transistor formed on the SOI substrate SB1.

In the semiconductor device of the first embodiment, the MISFET Q1 is formed by using the SOTB technology and the FD-SOI technology. Namely, in the semiconductor device of the first embodiment, an SOI layer located below a gate electrode of the MISFET Q1 is a channel having a sufficiently low impurity concentration or a channel to which no impurity is introduced, that is, a dopant-free channel.

First, the specific configuration of the SOI substrate SB1 will be described. The SOI substrate SB1 has a base substrate SS1, a ground plane region GP, a BOX layer 3 as an insulating layer, that is, a buried oxide film and an SOI layer 4 as a semiconductor layer. The ground plane region GP is formed on the base substrate SS1, the BOX layer 3 is formed on the ground plane region GP, and the SOI layer 4 is formed on the BOX layer 3. Also, the MISFET Q1 as a semiconductor element is formed on the SOI layer 4.

In the specification of this application, an upper surface of the SOI layer 4 is defined as a main surface PS of the SOI substrate SB1 for convenience of description.

The base substrate SS1 is made of, for example, a silicon (Si) substrate and preferably made of a single crystal silicon substrate. The BOX layer 3 is made of, for example, a silicon oxide film. A thickness of the BOX layer 3 is, for example, about 30 nm. The SOI layer 4 is made of, for example, a single crystal silicon layer. A thickness of the SOI layer 4 is, for example, about 20 nm.

The ground plane region GP includes a semiconductor region 1. The semiconductor region 1 is made of, for example, a silicon carbide (SiC) film and has an impurity diffusion coefficient smaller than that of the base substrate SS1 made of a silicon (Si) substrate. Also, when the MISFET Q1 is an n channel type MISFET, a p type impurity such as boron (B) is introduced to the semiconductor region 1 and the semiconductor region 1 is a p type semiconductor region.

In this manner, as described later with reference to FIG. 29, the impurity diffusion coefficient in the semiconductor region 1 can be reduced in comparison with the case where the semiconductor region 1 is made of silicon, for example, apart of the base substrate SS1 made of a silicon (Si) substrate. Therefore, the impurity concentration in the semiconductor region 1 can be kept high even after the activation annealing, and the potential of the semiconductor region 1 with respect to the SOI layer 4, that is, the absolute value of a built-in potential Vbi can be increased. Therefore, the variable range of the threshold voltage of the MISFET Q1 can be expanded. A thickness TH1 of the semiconductor region 1 is a half-value width of a peak value of the ion implantation to the ground plane region and is, for example, about 70 nm.

Preferably, the semiconductor region 1 made of SiC is formed by epitaxial growth on the base substrate SS1 made of Si. Thus, the thickness TH1 of the semiconductor region 1 can be increased in comparison with the case where the semiconductor region made of SiC is formed by ion-implanting carbon (C) to an upper layer part of the base substrate SS1 made of Si. Also, when the semiconductor region 1 is formed by the epitaxial growth, the amount of carbon introduced to the semiconductor region 1 can be easily increased in comparison with the case where the semiconductor region 1 is formed by the ion implantation.

Note that the epitaxial growth of the semiconductor region 1 on the base substrate SS1 means that the semiconductor region 1 is grown on the base substrate SS1 so that crystal of the semiconductor region 1 to be grown is arranged orderly on a crystal plane of the underlying base substrate SS1.

Preferably, x in the case where a composition formula of silicon carbide (SiC) is expressed as $Si_{1-x}C_x$, that is, a composition ratio of carbon with respect to a sum of silicon (Si) and carbon (C) is 0.01 or more. When x is 0.01 or more, the impurity diffusion coefficient in the semiconductor region 1 can be reliably reduced in comparison with the case where the semiconductor region 1 is made of Si.

More preferably, x is 0.01 to 0.10. When x is 0.10 or less, the semiconductor region 1 made of SiC can be easily formed by ion-implanting carbon into an upper layer part of the base substrate SS1.

Still more preferably, x is 0.01 to 0.014. When x is 0.014 or less, since the difference in lattice constant between the crystal lattice of Si in the base substrate SS1 and the crystal lattice of SiC in the semiconductor region 1 becomes small, it is possible to prevent or suppress the occurrence of strain in the semiconductor region 1 made of SiC.

Also, as described later with reference to FIG. 29, preferably, the impurity concentration distribution in the thickness direction of the semiconductor region 1 has a peak between the upper surface of the semiconductor region 1 and the lower surface of the semiconductor region 1, and the thickness TH1 of the semiconductor region 1 is larger than a half-value width $\Delta Rp$ of the peak. Alternatively, the impurity concentration distribution in the thickness direction of the semiconductor region 1 preferably has a peak between the upper surface of the semiconductor region 1 and the lower surface of the semiconductor region 1, and both of the impurity concentration of the upper surface of the semiconductor region 1 and the impurity concentration of the lower surface of the semiconductor region 1 are lower than the half of the impurity concentration at the peak.

In this manner, since a part having at least the impurity concentration equal to or higher than ½ of the impurity concentration at the peak, that is, the peak value is included in the semiconductor region 1, the impurity concentration in the semiconductor region 1 can be reliably increased. Thus, it is possible to prevent or suppress the decrease of the average value of the impurity concentration in the entire ground plane region GP even after the activation annealing.

Also, the SOI substrate SB1 has an element isolation region AR0 and a MISFET formation region AR1 as an active region. The element isolation region AR0 and the MISFET formation region AR1 are defined on the side of the main surface PS of the SOI substrate SB1. In the element isolation region AR0, an element isolation film 6 made of an insulating film is formed in an element isolation trench 5.

The MISFET formation region AR1 is a region delimited by the element isolation region AR0, and the MISFET Q1 is formed in the MISFET formation region AR1.

In the first embodiment, the case where the n channel type MISFET Q1 is formed in the MISFET formation region AR1 will be described. However, a p channel type MISFET with an opposite conductivity type may be formed in another MISFET formation region different from the MISFET formation region AR1, and a CMISFET (Complementary MISFET) may also be formed.

When a p channel type MISFET is formed in a MISFET formation region different from the MISFET formation region AR1, in the different MISFET formation region, an n type impurity is introduced to a semiconductor region formed in the same layer as the semiconductor region 1 in the MISFET formation region AR1, and the semiconductor region is an n type semiconductor region.

In the MISFET formation region AR1, a well region 7 is formed in an upper layer part of the base substrate SS1. The well region 7 is a p type semiconductor region to which a p type impurity such as boron (B) is introduced. An impurity concentration in the well region 7 is, for example, about $5 \times 10^{17}$ to $5 \times 10^{18}$ cm$^{-3}$.

The well region 7 is formed from the MISFET formation region AR1 to a region AR2 outside the MISFET formation region AR1 when seen in a plan view. The element isolation region AR0 is formed between the MISFET formation region AR1 and the region AR2. In an upper layer part of the well region 7 formed in the region AR2, a contact region CR is formed. On the contact region CR, an opening OP which penetrates the BOX layer 3 and the SOI layer 4 to reach the well region 7 is formed, and the contact region CR is exposed at the bottom of the opening OP. The region AR2 in which the contact region CR is exposed is referred to as a tap, and is the region in which a plug PG electrically connected to the contact region CR is formed. Namely, in the region AR2, the plug PG is formed on the contact region CR, and the well region 7 located in the region AR2 is electrically connected to the plug PG through the contact region CR.

The well region 7 located in the region AR2 may be electrically connected to a voltage generation circuit, which applies a substrate bias, through the contact region CR and the plug PG. In this manner, the substrate bias can be applied to the ground plane region GP and the variable range of the threshold voltage of the MISFET Q1 can be further expanded in comparison with the case where the substrate bias is not applied to the ground plane region GP.

Note that, when a p channel type MISFET is formed in a MISFET formation region different from the MISFET formation region AR1, an n type well region is formed in an upper layer part of the base substrate SS1 in the different MISFET formation region.

Also, a MISFET Q2 is formed in a region AR3. The MISFET Q2 is a high withstand voltage transistor mainly used for an input/output circuit and others. The MISFET Q2 is formed on the surface of the base substrate SS1 from which the SOI layer 4 and the BOX layer 3 have been removed unlike the MISFET Q1. In the following drawings, the descriptions of the region AR3 and the MISFET Q2 are omitted for the simplification except when these are necessary.

Next, a specific configuration of the n channel type MISFET Q1 formed in the MISFET formation region AR1 will be described.

The MISFET Q1 has a channel region CH made of the SOI layer 4, a gate insulating film GI, a gate electrode GE, insulating films IF1 and IF2, extension regions EX1 and EX2 made of the SOI layer 4, sidewall spacers SW1 and SW2 and source/drain regions SD1 and SD2 as semiconductor regions.

For the convenience of description, in the specification of this application, the MISFET Q1 is assumed to be made up of parts formed above the BOX layer 3 such as the channel region CH, the extension regions EX1 and EX2 and others. However, a threshold voltage Vth of the MISFET Q1 is adjusted not only by a work function of the conductive film included in the gate electrode GE, but also by the build-in potential Vbi of the ground plane region GP corresponding to a back gate.

In the MISFET formation region AR1, the gate electrode GE is formed via the gate insulating film GI on the channel region CH made of the SOI layer 4.

The gate insulating film GI is, for example, a silicon oxide film or a silicon oxynitride film. Alternatively, a high-k film which is a metal oxide film such as a hafnium oxide (HfO$_2$) film, a zirconium oxide (ZrO$_2$) film, an aluminum oxide (Al$_2$O$_3$) film, a tantalum oxide (Ta$_2$O$_5$) film or a lanthanum oxide (La$_7$O$_3$) film may also be used as the gate insulating film GI. Furthermore, a stacked film of a silicon oxide film or a silicon oxynitride film and a high-k film may be used as the gate insulating film GI.

Note that, in the specification of this application, the high-k film means a film having a dielectric constant higher than that of a silicon nitride film, that is, a high dielectric constant film.

The gate electrode GE is made of, for example, a polycrystalline silicon film whose resistivity is reduced by introducing an impurity, that is, a doped polycrystalline silicon film. Alternatively, a metal film such as a titanium nitride (TiN) film, a tantalum nitride (TaN) film, a tungsten nitride (WN) film, a titanium carbide (TiC) film, a tantalum carbide (TaC) film, a tungsten carbide (WC) film or a tantalum carbonitride (TaCN) film may be used as the gate electrode GE.

Note that a film having an MIPS (Metal Inserted Polysilicon Stack) structure which is a stacked structure of these metal films and a polycrystalline silicon film can be used as the gate electrode GE.

In the MISFET formation region AR1, the extension region EX1 is formed in a part of the SOI layer 4 located on one side of both sides of the gate electrode GE, and the extension region EX2 is formed in a part of the SOI layer 4 located on the other side when seen in a plan view. Each of the extension regions EX1 and EX2 is an n type semiconductor region to which an n type impurity such as phosphorus (P) or arsenic (As) has been introduced. An impurity concentration in each of the extension regions EX1 and EX2 is, for example, about $2 \times 10^{19}$ cm$^{-3}$ or higher, preferably, about $1 \times 10^{20}$ cm$^{-3}$ or higher.

Note that, when a p channel type MISFET is formed in a MISFET formation region different from the MISFET formation region AR1, in the different MISFET formation region, a p type impurity is ion-implanted to an SOI layer formed in the same layer as the SOI layer 4 in the MISFET formation region AR1, and a p type extension region is formed.

When seen in a plan view, on one of the side surfaces of the gate electrode GE, a sidewall spacer SW1 as a sidewall insulating film is formed via an insulating film IF1 as an offset spacer. Also, when seen in a plan view, on the other of the side surfaces of the gate electrode GE, a sidewall spacer SW2 as a sidewall insulating film is formed via an insulating film IF2 as an offset spacer. Each of the sidewall spacers SW1 and SW2 is made of, for example, a silicon oxide film.

In the MISFET formation region AR1, when seen in a plan view, the source/drain region SD1 made of an epitaxial silicon film grown by the selective epitaxial growth is formed on a part of the SOI layer 4 located on a side opposite to the gate electrode GE with the sidewall spacer SW1 interposed therebetween, that is, on the extension region EX1. Also, in the MISFET formation region AR1, when seen in a plan view, the source/drain region SD2 made of an epitaxial silicon film grown by the selective epitaxial growth is formed on a part of the SOI layer 4 located on a side opposite to the gate electrode GE with the sidewall spacer SW2 interposed therebetween, that is, on the extension region EX2.

Each of the source/drain regions SD1 and SD2 is an n type semiconductor region to which an n type impurity such as phosphorus (P) or arsenic (As) is introduced. An impurity concentration in each of the source/drain regions SD1 and SD2 is higher than the impurity concentration in the extension regions EX1 and EX2 and is, for example, about $5 \times 10^{20}$ cm$^{-3}$ or higher.

The source/drain region SD1 is in contact with the extension region EX1 and an n type impurity concentration in the source/drain region SD1 is higher than the n type impurity concentration in the extension region EX1. Also, the source/drain region SD2 is in contact with the extension region EX2 and an n type impurity concentration in the source/drain region SD2 is higher than the n type impurity concentration in the extension region EX2.

In this manner, the source/drain region made up of the extension region EX1 and the source/drain region SD1 having an impurity concentration higher than that of the extension region EX1 and having an LDD (Lightly Doped Drain) structure can be formed. Also, the source/drain region made up of the extension region EX2 and the source/drain region SD2 having an impurity concentration higher than that of the extension region EX2 and having an LDD (Lightly Doped Drain) structure can be formed.

Alternatively, source/drain regions formed by introducing an n type impurity into parts of the SOI layer 4 each located on a side opposite to the gate electrode GE with the sidewall spacer SW1 interposed therebetween and on aside opposite to the gate electrode GE with the sidewall spacer SW2 interposed therebetween when seen in a plan view can be used as the source/drain regions SD1 and SD2.

In the MISFET formation region AR1, a metal silicide layer SL such as a cobalt silicide layer or a nickel silicide layer is formed on the surfaces of the source/drain regions SD1 and SD2 and the gate electrode GE by, for example, the silicide (Self Aligned Silicide) technology. Note that, in the region AR2, the metal silicide layer SL is formed on the upper surface of the contact region CR.

On the main surface PS of the SOI substrate SB1, an interlayer insulating film IL1 is formed so as to cover the n channel type MISFET Q1. The interlayer insulating film IL1 is made of, for example, a single film of a silicon oxide film or a stacked film of a silicon nitride film and a silicon oxide film thicker than the silicon nitride film, and an upper surface of the interlayer insulating film IL1 is planarized.

A contact hole CN is formed in the interlayer insulating film IL1 and a conductive plug PG is formed in the contact hole CN. In the MISFET formation region AR1, for example, the contact hole CN and the plug PG are formed on each of the source/drain regions SD1 and SD2 and on the gate electrode GE (not shown). In the region AR2, the contact hole CN and the plug PG are formed on the contact region CR. In the MISFET formation region AR1, the bottom of the plug PG is electrically connected to each of the source/drain regions SD1 and SD2, the gate electrode GE (not shown) and others. In the region AR2, the bottom of the plug PG is electrically connected to the contact region CR.

On the interlayer insulating film IL1 in which the plug PG has been buried, an insulating film IL2 made of, for example, a silicon oxide film is formed, and a wiring ML1 as a first layer wiring is formed in a wiring trench formed in the insulating film IL2, that is, an opening. In the MISFET formation region AR1, the wiring ML1 is electrically connected to each of the source/drain regions SD1 and SD2, the gate electrode (not shown) and others through the plug PG. In the region AR2, the wiring ML1 is electrically connected to the contact region CR through the plug PG.

As the wiring ML1, a conductor film having copper (Cu) formed by, for example, the damascene technology as a main conductor film can be used, and as another aspect, a conductor film made of a patterned tungsten (W) film or aluminum (Al) film can also be used.

<Manufacturing Method of Semiconductor Device>

Figure 2:
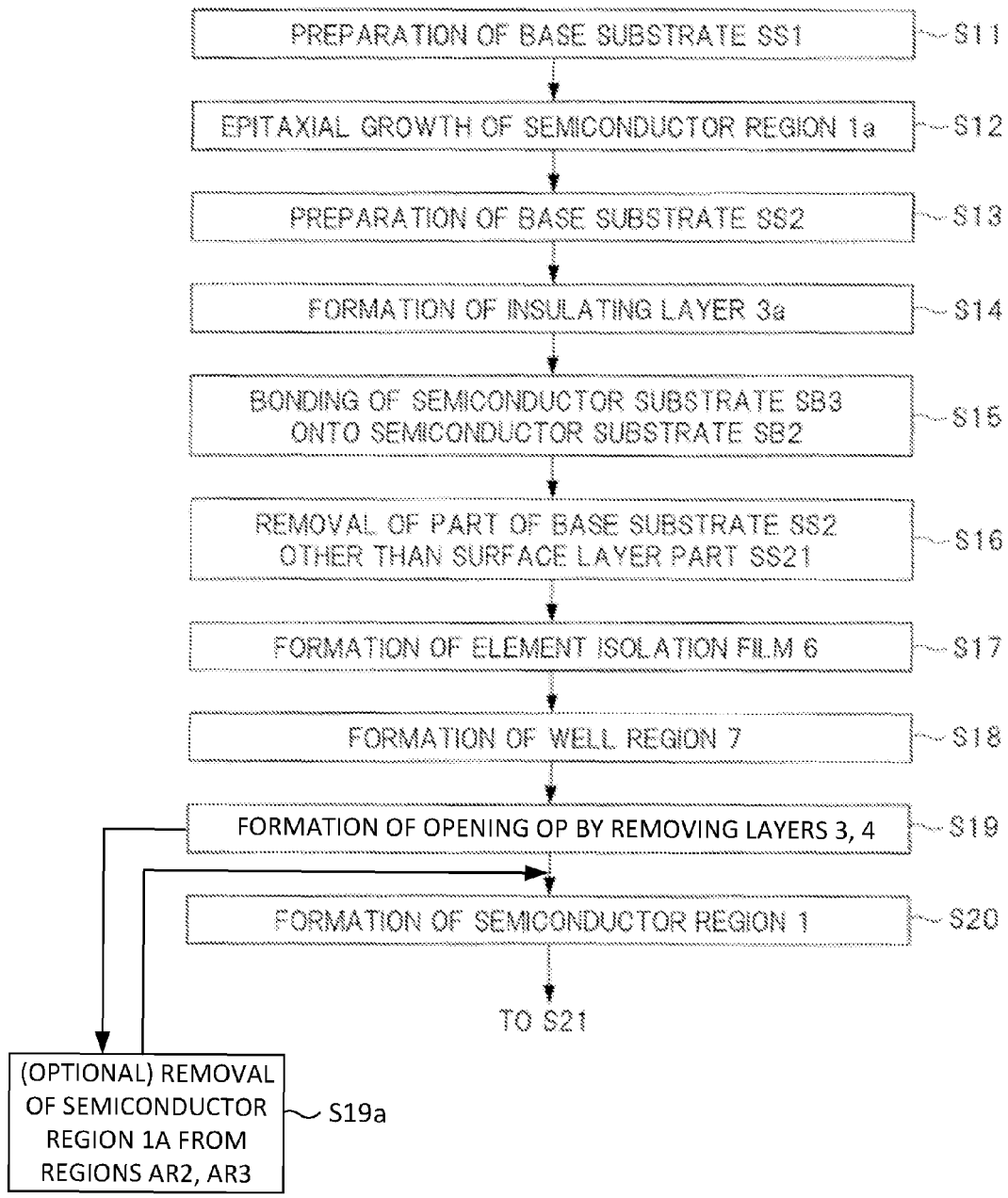
FIG. 2 is a process flowchart showing a part of a manufacturing process of the semiconductor device of the first embodiment.
Figure 3:
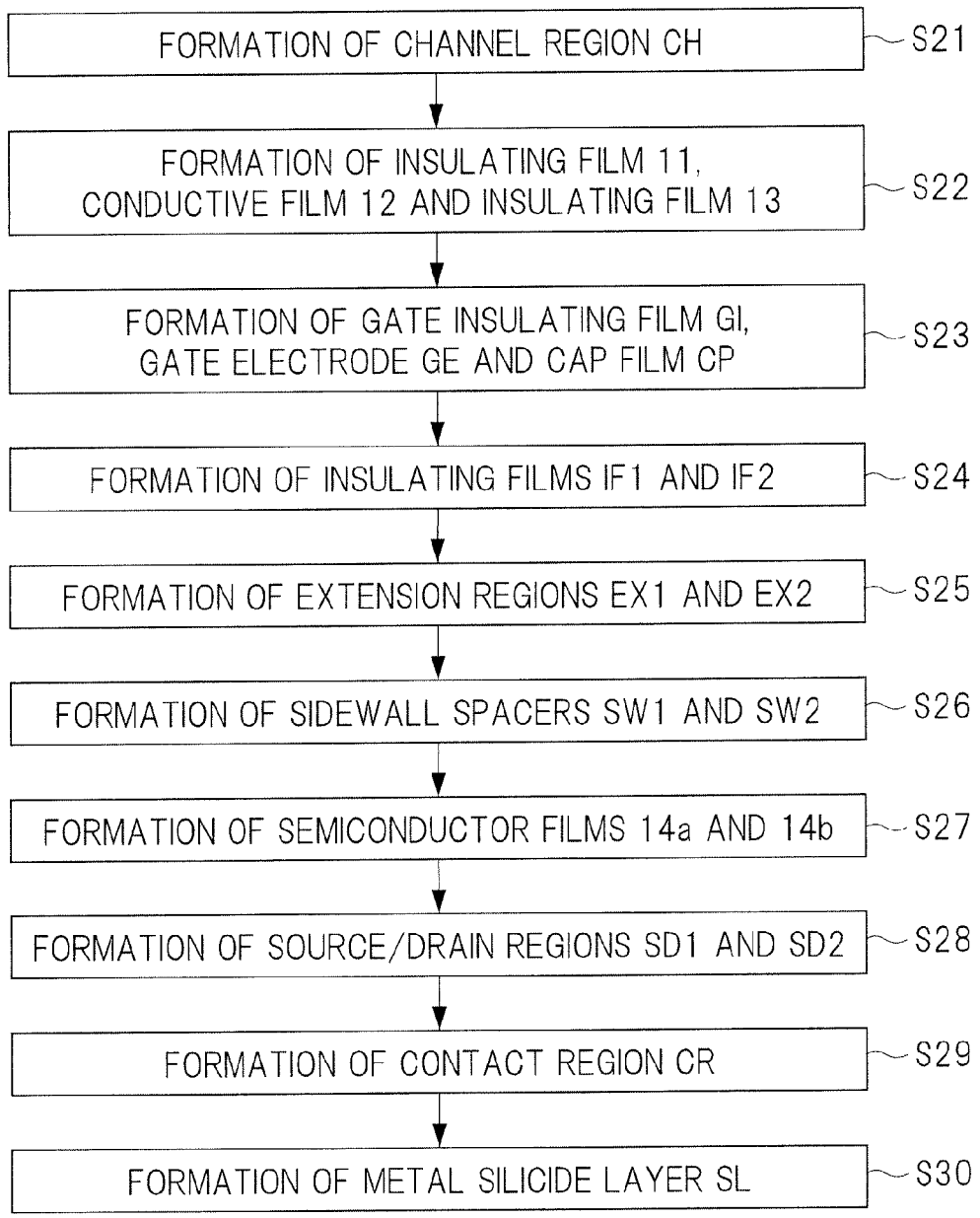
FIG. 3 is a process flow chart showing a part of the manufacturing process of the semiconductor device of the first embodiment.

Next, a manufacturing method of a semiconductor device of the first embodiment will be described. FIG. 2 and FIG. 3 are process flow charts showing parts of the manufacturing process of the semiconductor device of the first embodiment. FIGS. 4 to 21 are cross-sectional views showing a principal part in the manufacturing process of the semiconductor device of the first embodiment.

In the first embodiment, the case where the n channel type MISFET Q1 (see FIG. 1) is formed in the MISFET formation region AR1 will be described. However, a p channel type MISFET with an opposite conductivity type may be formed in another MISFET formation region different from the MISFET formation region AR1, and a CMISFET (Complementary MISFET) may be formed.

At the beginning, a process of preparing the SOI substrate SB1 will be described with reference to FIGS. 4 to 7.

Figure 4:
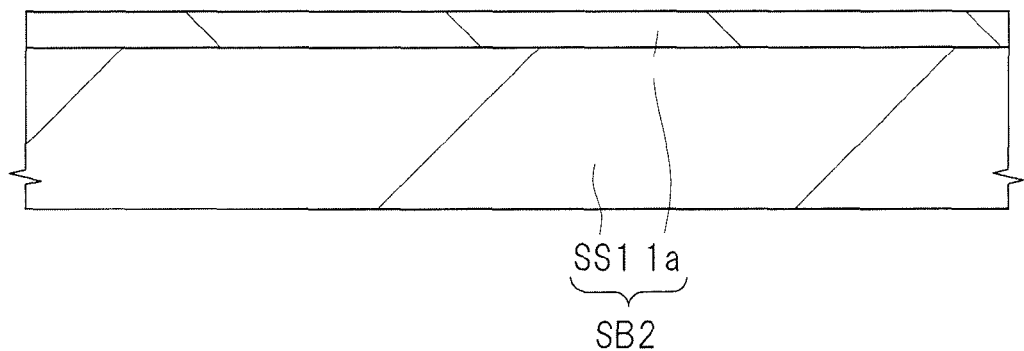
FIG. 4 is a cross-sectional view showing a principal part in the manufacturing process of the semiconductor device of the first embodiment.

First, as shown in FIG. 4, the base substrate SS1 is prepared (step S11 of FIG. 2). In this step S11, the base substrate SS1 made of, for example, a silicon (Si) substrate is prepared. Preferably, the base substrate SS1 is made of, for example, a p type single crystal silicon substrate with a plane orientation of (100) and a resistivity of about 5 Ωcm. Since the base substrate SS1 is made of a single crystal silicon substrate, the semiconductor region 1a can be easily epitaxially grown on the base substrate SS1 in a step S12 described later.

Next, as shown in FIG. 4, the semiconductor region 1a is epitaxially grown on the base substrate SS1 (step S12 of FIG. 2). In this step S12, the semiconductor region 1a for the ground plane region made of, for example, a silicon carbide (SiC) film is epitaxially grown by, for example, chemical vapor deposition (CVD) on the base substrate SS1. In this manner, a semiconductor substrate SB2 made up of the base substrate SS1 and the semiconductor region 1a is prepared.

Preferably, x in the case where a composition formula of silicon carbide (SiC) is expressed as $Si_{1-x}C_x$, that is, a composition ratio of carbon with respect to a sum of silicon (Si) and carbon (C) is 0.01 or more. When x is 0.01 or more, the impurity diffusion coefficient in the semiconductor region 1a can be reliably reduced in comparison with the case where the semiconductor region 1a is made of Si.

In the first embodiment, when the semiconductor region 1a is epitaxially grown, the amount of carbon introduced to the semiconductor region 1 can be easily increased in comparison with the case where the semiconductor region 1a is formed by ion implantation in a modified example of the first embodiment described later. For example, even when x is larger than 0.10, the semiconductor region 1a made of SiC can be easily formed.

More preferably, x is 0.01 to 0.014. When x is 0.014 or less, since the difference in lattice constant between the crystal lattice of Si in the base substrate SS1 and the crystal lattice of SiC in the semiconductor region 1a becomes small, it is possible to prevent or suppress the occurrence of strain in the semiconductor region 1a made of SiC. Namely, in the ion implantation described later, it is necessary to implant high-concentration carbon in order to obtain a necessary composition ratio. At this time, if the implantation amount is too large, the strain may occur in the crystal. Meanwhile, the epitaxial growth has the advantage that a desired composition ratio can be easily obtained without occurrence of the strain.

Figure 5:
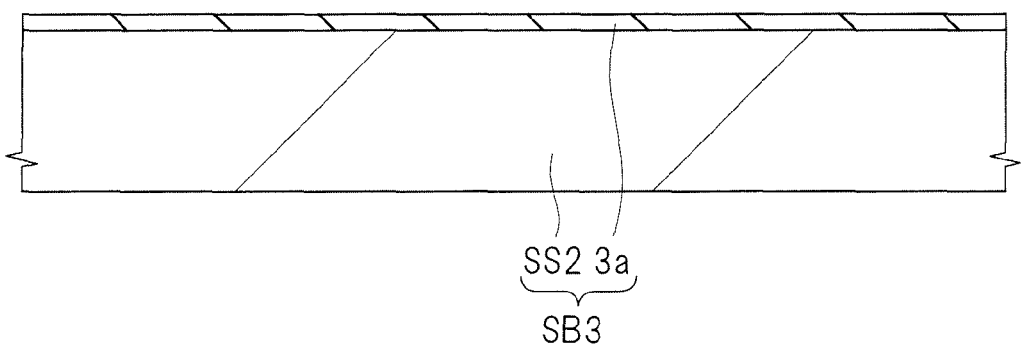
FIG. 5 is a cross-sectional view showing a principal part in the manufacturing process of the semiconductor device of the first embodiment.

Next, as shown in FIG. 5, a base substrate SS2 is prepared (step S13 of FIG. 2). In this step S13, the base substrate SS2 made of semiconductor such as a silicon (Si) substrate is prepared. Preferably, the base substrate SS2 is made of, for example, a p type single crystal silicon substrate with a plane orientation of (100) and a resistivity of about 5 Ωcm. Since the base substrate SS2 is made of a single crystal silicon substrate, the SOI layer 4 (see FIG. 7) made of a surface layer part SS21 of the base substrate SS2 can be made of single crystal silicon with a plane orientation of (100) and a crystal orientation in a direction parallel to an orientation flat or a notch of <110>.

Next, as shown in FIG. 5, an insulating layer 3a is formed (step S14 of FIG. 2). In this step S14, the insulating layer 3a made of, for example, a silicon oxide film is formed by, for example, the thermal oxidation method on the surface of the base substrate SS2. A thickness of the insulating layer 3a is, for example, 30 nm. In this manner, a semiconductor substrate SB3 made up of the base substrate SS2 and the insulating layer 3a formed on the base substrate SS2 is prepared.

Figure 6:
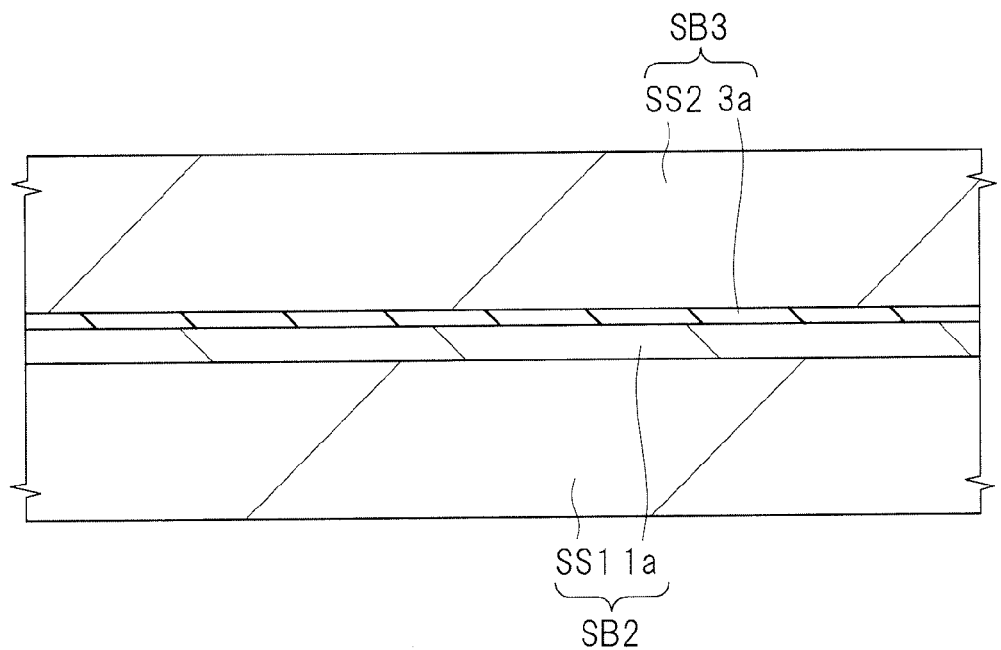
FIG. 6 is a cross-sectional view showing a principal part in the manufacturing process of the semiconductor device of the first embodiment.

Next, as shown in FIG. 6, the semiconductor substrate SB3 is bonded onto the semiconductor substrate SB2 (step S15 of FIG. 2). In this step S15, in the state where the insulating layer 3a faces the semiconductor region 1a, the semiconductor substrate SB3 and the semiconductor substrate SB2 are pressure-bonded so that the insulating layer 3a comes into contact with the semiconductor region 1a. Then, the semiconductor substrate SB3 and the semiconductor substrate SB2 are retained at a high temperature of, for example, 1000° C. and are subjected to a thermal treatment. In this manner, the semiconductor substrate SB3 is boned onto the semiconductor substrate SB2. At this time, the insulating layer 3a and the semiconductor region 1a are joined.

Figure 7:
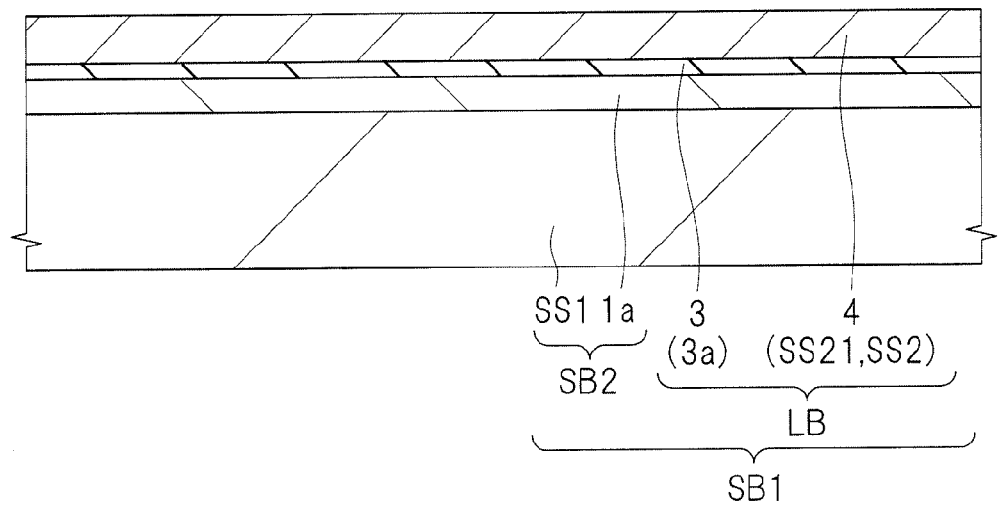
FIG. 7 is a cross-sectional view showing a principal part in the manufacturing process of the semiconductor device of the first embodiment.

Next, as shown in FIG. 7, the base substrate SS2 of the semiconductor substrate SB3 bonded onto the semiconductor substrate SB2 is removed except the surface layer part SS21 on a side close to the semiconductor substrate SB2 (step S16 of FIG. 2).

In this step S16, the semiconductor substrate SB3 bonded onto the semiconductor substrate SB2 is polished until the thickness of the base substrate SS2 of the semiconductor substrate SB3 is reduced to, for example, about 15 nm. In this manner, the base substrate SS2 on the semiconductor substrate SB2 is removed except the surface layer part SS21 on the side close to the semiconductor substrate SB2, and the insulating layer 3a and the surface layer part SS21 are left on the semiconductor substrate SB2.

Alternatively, in this step S16, another method such as the smart cut technology can be used. In the case of using the smart cut method, for example, in the step S14, after the insulating layer 3a is formed, hydrogen ions are implanted into a predetermined height position from the upper surface of the base substrate SS2 so as to delimit the surface layer part SS21 from the base substrate SS2 other than the surface layer part SS21, thereby forming a defect formation surface having the defect formed by the hydrogen ion implantation. Then, after the semiconductor substrate SB3 is bonded onto the semiconductor substrate SB2 in the step S15, they are subjected to the thermal treatment at, for example, 400 to 600° C. and the base substrate SS2 other than the surface layer part SS21 is separated and removed in the defect formation surface in the step S16.

By the method described above, a stacked body LB made up of the BOX layer 3 made of the insulating layer 3a and the SOI layer 4 as a semiconductor layer made of the surface layer part SS21 disposed on the insulating layer 3a is transferred onto the semiconductor region 1, that is, onto the semiconductor substrate SB2. Thus, the SOI substrate SB1 including the base substrate SS1, the semiconductor region 1a formed on the base substrate SS1, the BOX layer 3 formed on the semiconductor region 1a and the SOI layer 4 formed on the BOX layer 3 is prepared.

Next, a process of fabricating the MISFET Q1 on the SOI substrate SB1 will be described with reference to FIGS. 8 to 19.

Figure 8:
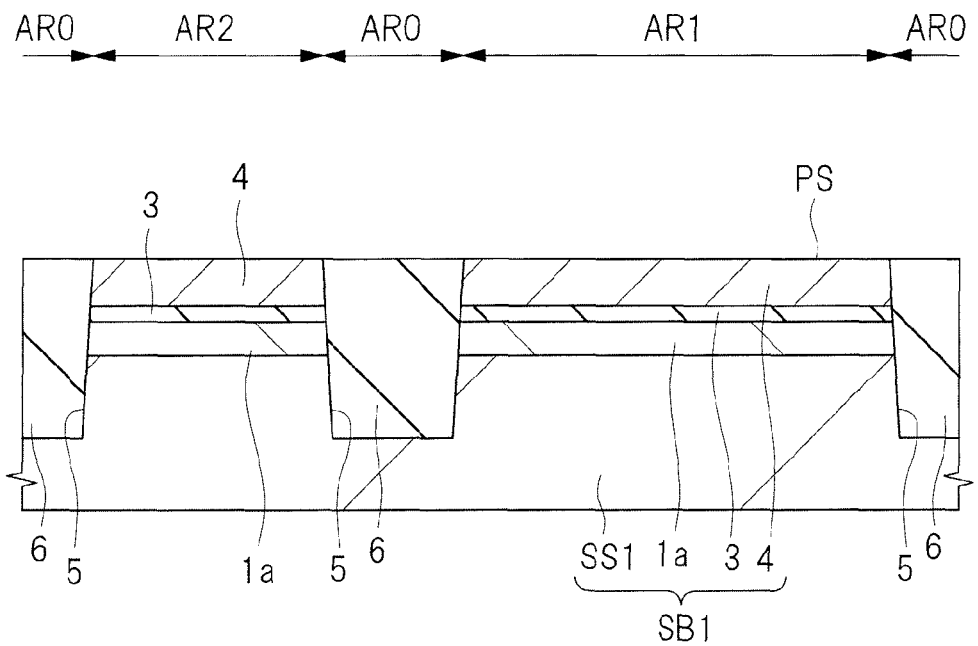
FIG. 8 is a cross-sectional view showing a principal part in the manufacturing process of the semiconductor device of the first embodiment.

First, as shown in FIG. 8, the element isolation films 6 are formed (step S17 of FIG. 2). In this step S17, a silicon oxide film (not shown) and a silicon nitride film (not shown) are sequentially formed on the main surface PS of the SOI substrate SB1. Next, a resist film (not shown) which defines the element isolation region AR0 for delimiting the MISFET formation regions AR1 and AR2 is formed by photolithography. Then, the silicon nitride film and the silicon oxide film in the element isolation region AR0 are removed by the dry etching using the resist film as a mask and a part of the base substrate SS1 is subsequently removed by anisotropic dry etching. In this manner, the element isolation trench 5 is formed in the element isolation region AR0. In this case, the SOI layer 4, the BOX layer 3, the semiconductor region 1a and the base substrate SS1 are etched in this order while changing the etching gas. The element isolation trench 5 thus formed has a depth of, for example, about 300 nm.

Next, a silicon oxide film is formed on the SOI substrate SB1 in the element isolation region AR0 and the MISFET formation regions AR1 and AR2 by high density plasma (HDP) CVD. Then, the silicon oxide film is polished in the element isolation region AR0 and the MISFET formation regions AR1 and AR2 by chemical mechanical polishing (CMP), and the silicon nitride film (not shown) is removed in the MISFET formation regions AR1 and AR2 by wet etching. In this manner, the element isolation film 6 is formed in the element isolation trench 5 formed in the main surface PS of the SOI substrate SB1 in the element isolation region AR0.

Figure 9:
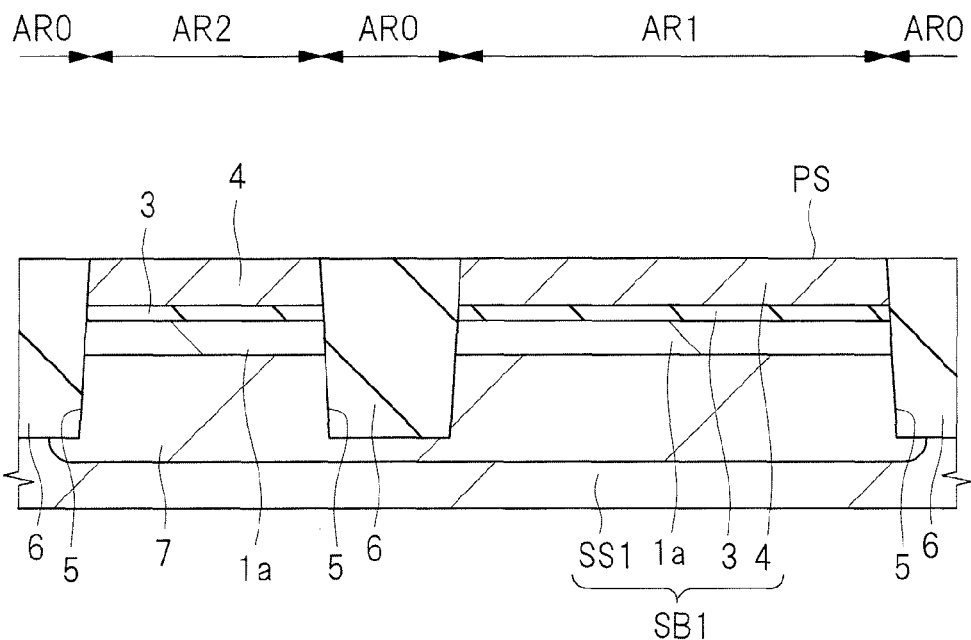
FIG. 9 is a cross-sectional view showing a principal part in the manufacturing process of the semiconductor device of the first embodiment.

Next, as shown in FIG. 9, the p type well region 7 is formed (step S18 of FIG. 2). In this step S18, a p type impurity is ion-implanted with using a resist film (not shown) having an opening formed from the MISFET formation region AR1 to the MISFET formation region AR2 as a mask, thereby forming the p type well region 7 in the upper layer part of the base substrate SS1 made of, for example, a silicon substrate from the MISFET formation region AR1 to the MISFET formation region AR2. Implantation conditions for the ion implantation are adjusted so that the well region 7 has the p type impurity concentration of, for example, about $5\times10^{17}$ to $5\times10^{18}$ $cm^{-3}$.

Note that, when a p channel type MISFET is formed in a different MISFET formation region (not shown), by ion-implanting an n type impurity with using a different resist film as a mask, an n type well region can be formed in the base substrate SS1 in the different MISFET formation region.

Also, after the step S18, by performing the thermal treatment at the temperature of, for example, about 1000° C., the impurity ion-implanted into the well region 7 can be activated (the same is true of impurities ion-implanted into respective semiconductor regions below except the impurity ion-implanted into the semiconductor region 1a).

In the first embodiment, the SOI layer 4 has a thickness of, for example, about 15 nm, the BOX layer 3 has a thickness of, for example, about 30 nm and the semiconductor region 1a has a thickness of, for example, about 70 nm, and all of the SOI layer 4, the BOX layer 3 and the semiconductor region 1a are extremely thin. Therefore, when an impurity is ion-implanted into the base substrate SS1 from the upper surface of the SOI layer 4, most of the impurity can be introduced to the base substrate SS1 by adjusting the ion implantation energy.

Note that, in order to adjust the impurity concentration distribution in a thickness direction of the base substrate SS1, ion implantation processes each having different acceleration energies and implantation amounts may be performed multiple times in combination. By the impurity implantation amount and the temperature and time for the thermal treatment performed thereafter to the SOI substrate, the threshold voltage of the n channel type MISFET Q1 and the threshold voltage of the p channel type MISFET (not shown) can be appropriately adjusted.

Figure 10:
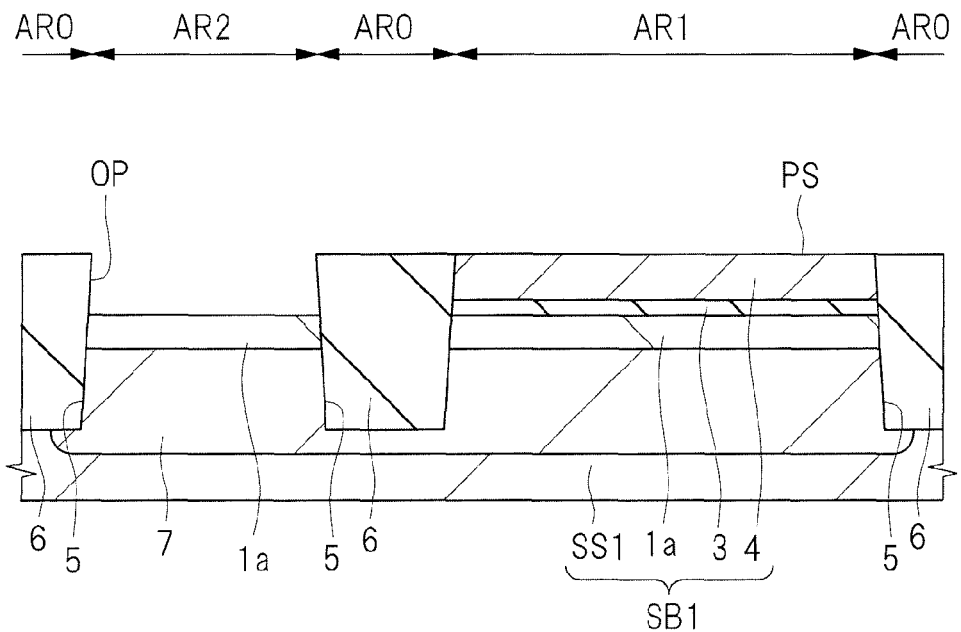
FIG. 10 is a cross-sectional view showing a principal part in the manufacturing process of the semiconductor device of the first embodiment.

Next, as shown in FIG. 10, the opening OP is formed (step S19 of FIG. 2). In this step S19, in the region AR2, a part of the SOI layer 4 is removed by the anisotropic dry etching using a resist film as a mask and the BOX layer 3 is subsequently removed by the wet etching, thereby forming the opening OP which penetrates the SOI layer 4 and the BOX layer 3 to reach the semiconductor region 1a. The opening OP is formed so as to ensure the electric contact with the base substrate SS1. Though not shown, the SOI layer 4 and the BOX layer 3 are removed not only in the region AR2 but also in the region AR3 (see FIG. 1).

Figure 1A:
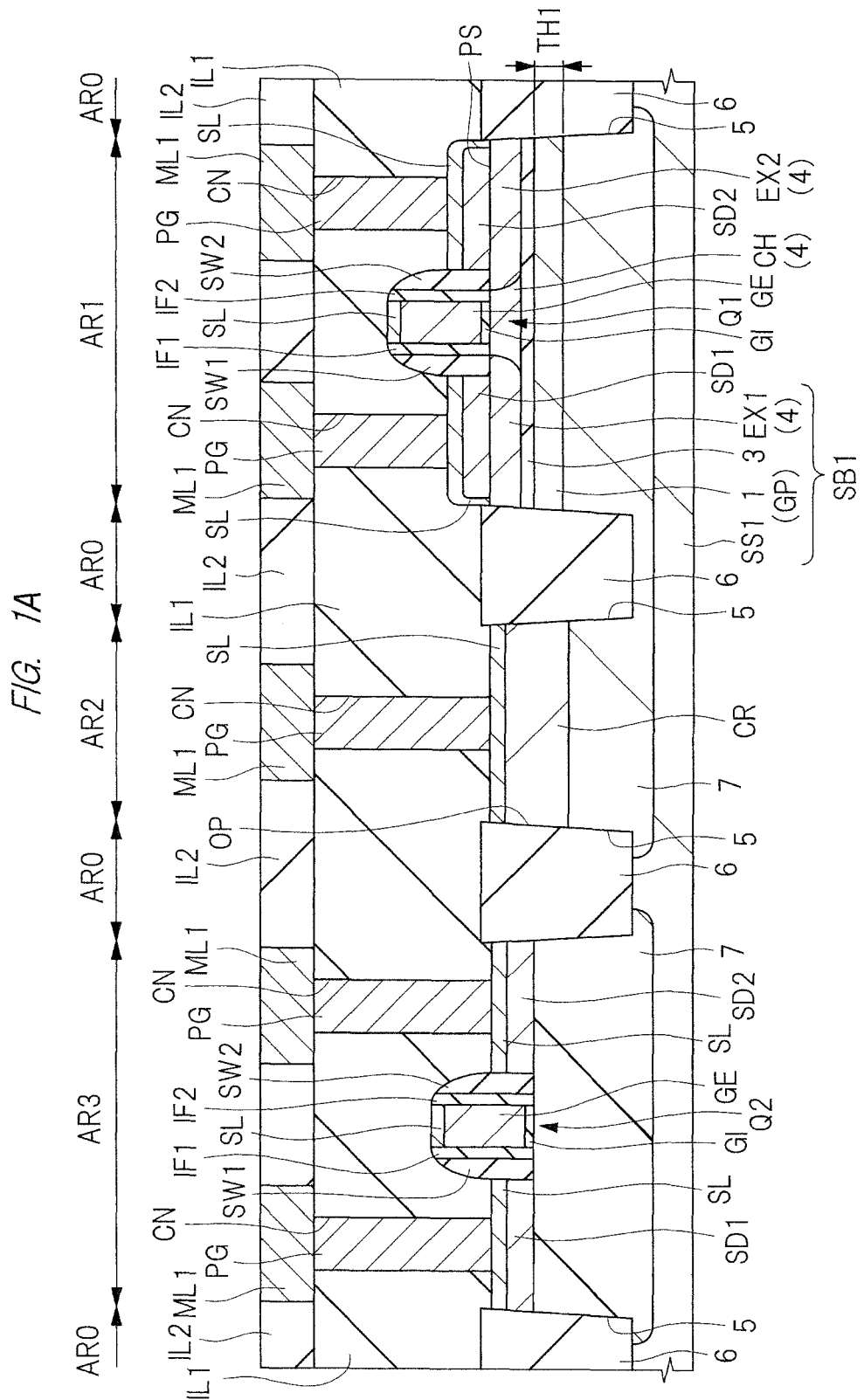
FIG. 1A is a cross-sectional view showing a principal part of a semiconductor device of a variation of the first embodiment.

Also, in this embodiment, the semiconductor region 1a is left in the region in which the SOI layer 4 and the BOX layer 3 are removed like the region AR2. Alternatively, the semiconductor region 1a may also be removed. It is sometimes better that the semiconductor region 1a to which carbon is introduced is not provided in the region AR2 and the region AR3 (see FIG. 1A). Namely, this is because there is a fear that the strain caused by carbon forms crystal defect on the surface of the base substrate SS1 in the region AR2 and the region AR3 and a leakage path is formed in the channel of the MISFET especially in the region AR3.

Figure 11:
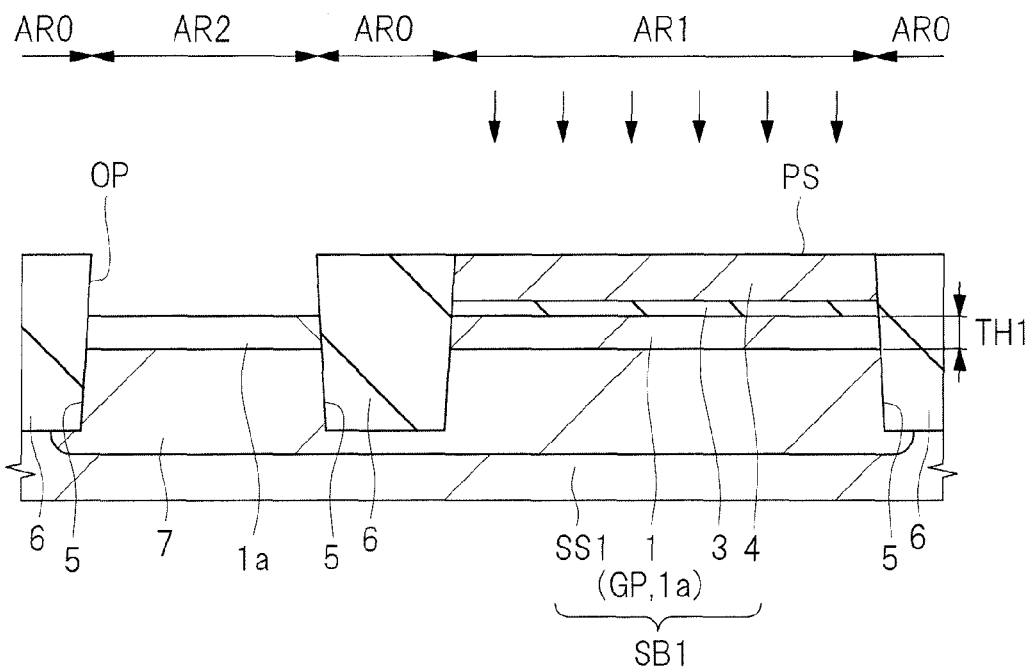
FIG. 11 is a cross-sectional view showing a principal part in the manufacturing process of the semiconductor device of the first embodiment.

Next, as shown in FIG. 11, the semiconductor region 1 is formed (step S20 of FIG. 2). In this step S20, a p type impurity is introduced by ion implantation to the semiconductor region 1a with using the resist film having an opening formed in the MISFET formation region AR1 as a mask, thereby forming the semiconductor region 1 made of the semiconductor region 1a to which the p type impurity has been introduced. In this manner, the ground plane region GP made of the semiconductor region 1 is formed.

A conductivity type of the impurity to be introduced to the semiconductor region 1a is the same as the conductivity type of the well region 7 located below the semiconductor region 1a. Also, a p type impurity concentration in the semiconductor region 1 made of the semiconductor region 1a to which the p type impurity has been introduced is higher than the p type impurity concentration in the well region 7. Implantation conditions for the ion implantation are adjusted so that the semiconductor region 1 has the p type impurity concentration of, for example, about $1 \times 10^{18}$ to $2 \times 10^{19}$ cm$^{-3}$.

Note that, when a p channel type MISFET is formed in a MISFET formation region different from the MISFET formation region AR1, an n type impurity is ion-implanted with using a different resist film as a mask. In this manner, in the different MISFET formation region, a ground plane region formed in the same layer as the semiconductor region 1 in the MISFET formation region AR1 and made of the semiconductor region to which an n type impurity has been introduced can be formed.

Also, in the step S20, after the impurity is ion-implanted into the semiconductor region 1a, the thermal treatment for the SOI substrate SB1, that is, activation annealing can be performed at a thermal treatment temperature of, for example, about 1000° C. In this manner, the ion-implanted impurity can be activated in the semiconductor region 1.

The thermal treatment temperature is preferably 800 to 1100° C. When the thermal treatment temperature is 800° C. or higher, the impurity ion-implanted into the semiconductor region 1 can be sufficiently activated in comparison with the case where the thermal treatment temperature is lower than 800° C. Also, when the thermal treatment temperature is 1100° C. or lower, the change in properties of respective parts of the SOI substrate SB1 can be prevented or suppressed in comparison with the case where the thermal treatment temperature is higher than 1100° C.

As described later with reference to FIG. 29, preferably, after the ion implantation and before the activation annealing, the concentration distribution of the impurity introduced to the semiconductor region 1 in the thickness direction of the semiconductor region 1 has a peak between the upper surface of the semiconductor region 1 and the lower surface of the semiconductor region 1, and the thickness TH1 of the semiconductor region 1 is larger than a half-value width of the peak. In such a case, as described later with reference to FIG. 29, even after the ion implantation is performed and the activation annealing is further performed, the concentration distribution of the impurity in the thickness direction of the semiconductor region 1 has a peak between the upper surface of the semiconductor region 1 and the lower surface of the semiconductor region 1, and the thickness TH1 of the semiconductor region 1 is larger than a half-value width ΔRp of the peak. Alternatively, the impurity concentration distribution in the thickness direction of the semiconductor region 1 preferably has a peak between the upper surface of the semiconductor region 1 and the lower surface of the semiconductor region 1, and both of the impurity concentration of the upper surface of the semiconductor region 1 and the impurity concentration of the lower surface of the semiconductor region 1 are lower than the half of the impurity concentration at the peak.

In this manner, since a part having at least the impurity concentration equal to or higher than ½ of the impurity concentration at the peak, that is, the peak value is included in the semiconductor region 1, the impurity concentration in the semiconductor region 1 can be reliably increased. Thus, it is possible to prevent or suppress the decrease of the average value of the impurity concentration in the entire ground plane region GP even after the activation annealing.

Note that it is also possible to introduce the impurity to the semiconductor region 1 by, for example, forming the semiconductor region 1 by the CVD using the source gas containing the impurity instead of the process of ion-implanting the impurity.

Figure 12:
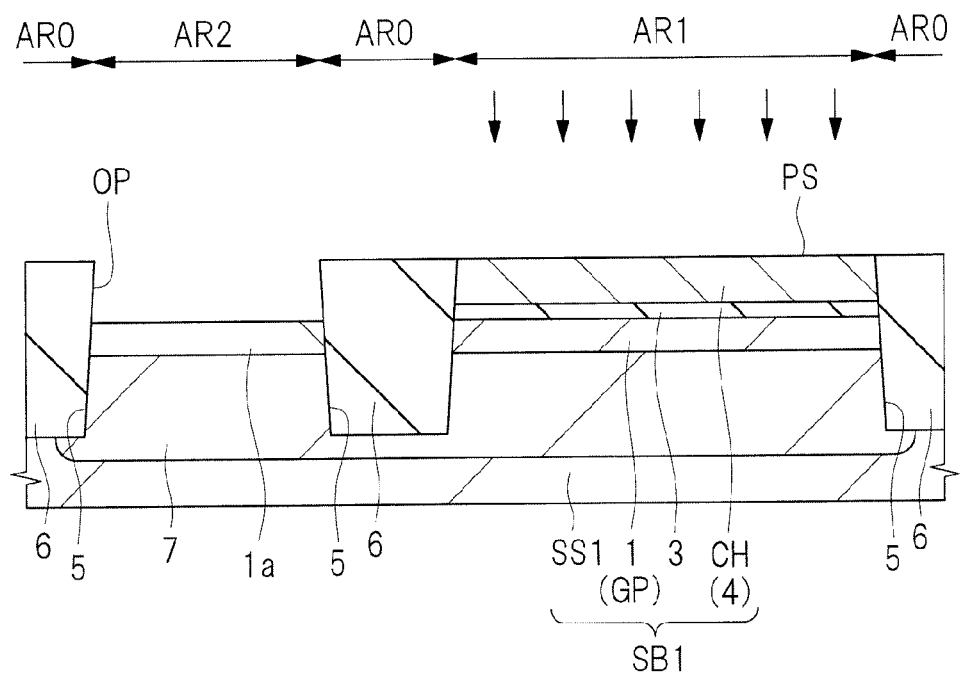
FIG. 12 is a cross-sectional view showing a principal part in the manufacturing process of the semiconductor device of the first embodiment.

Next, as shown in FIG. 12, the channel region CH is formed (step S21 of FIG. 3). In this step S21, as needed, an n type impurity is implanted to the SOI layer 4 as a p type semiconductor region with using a resist (not shown) having an opening formed in the MISFET formation region AR1 as a mask so as to reduce the net impurity concentration, thereby forming the channel region CH as a dopant-free semiconductor region. The impurity concentration of the channel region CH is about $2.5 \times 10^{18}$ cm$^{-3}$ or lower and is more preferably about $1 \times 10^{18}$ cm$^{-3}$ or lower.

Figure 13:
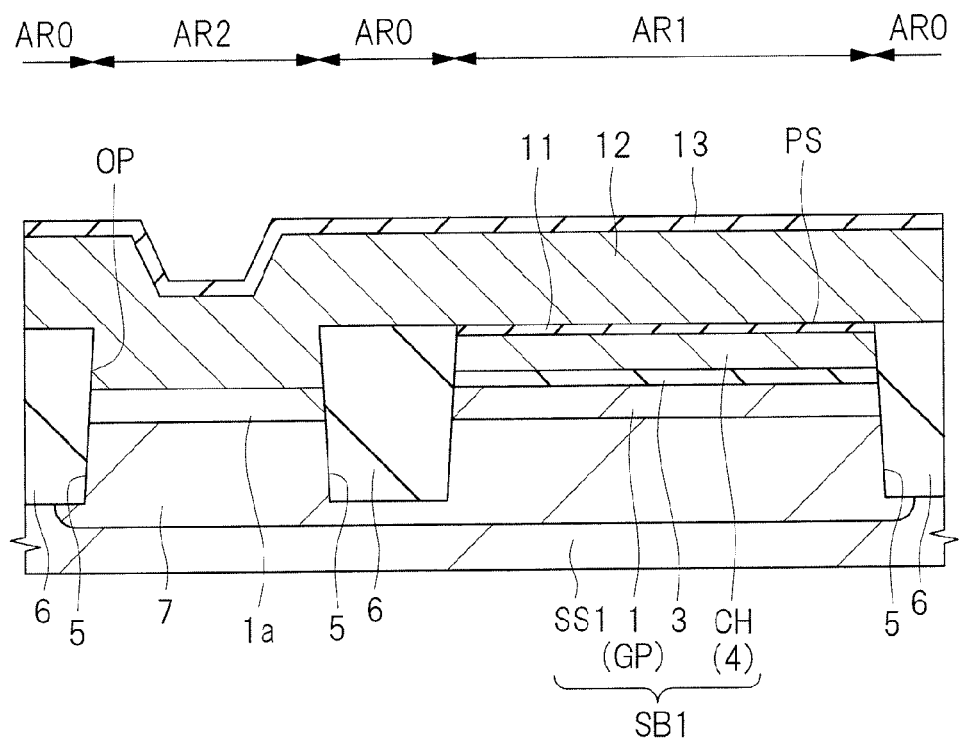
FIG. 13 is a cross-sectional view showing a principal part in the manufacturing process of the semiconductor device of the first embodiment.

Next, as shown in FIG. 13, an insulating film 11, a conductive film 12 and an insulating film 13 are formed (step S22 of FIG. 3). In this step S22, after the insulating film 11 for a gate insulating film is formed on the SOI layer 4 in the MISFET formation region AR1, the conductive film 12 for a gate electrode is formed on the insulating film 11 and the insulating film 13 for a cap film is formed on the conductive film 12. At this time, the conductive film 12 and the insulating film 13 are formed on the semiconductor region 1a in the region AR2, and the conductive film 12 and the insulating film 13 are formed on the element isolation film 6 in the element isolation region AR0.

The insulating film 11 is made of, for example, an HfSiON-based high dielectric constant film. The conductive film 12 is made of a stacked film obtained by, for example, sequentially forming a titanium nitride (TiN) film with a thickness of about 15 nm and then depositing a polycrystalline silicon film with a thickness of about 85 nm on the titanium nitride film. An impurity is added at high concentration to this polycrystalline silicon film in order to sufficiently increase the conductivity of the gate electrode. The insulating film 13 is made of, for example, a silicon nitride film with a thickness of about 50 nm.

Next, as shown in FIG. 14, the gate insulating film GI, the gate electrode GE and a cap film CP are formed (step S23 of FIG. 3). In this step S23, the insulating film 13, the conductive film 12 and the insulating film 11 are processed by dry etching using a resist film as a mask in the MISFET formation region AR1. In this manner, the gate insulating film GI made of the insulating film 11 left on the channel region CH, the gate electrode GE made of the conductive film 12 left on the gate insulating film GI and the cap film CP made of the insulating film 13 left on the gate electrode GE are formed. Namely, in the MISFET formation region AR1, the gate electrode GE is formed on the channel region CH made of the SOI layer 4 via the gate insulating film GI. A gate width of the gate electrode GE is, for example, about 100 nm or less and a gate length thereof is, for example, about 50 nm or less. In order to form the gate electrode GE with a gate length of about 50 nm or less, the photolithography using ArF stepper is used.

Next, as shown in FIG. 15, the insulating films IF1 and IF2 are formed (step S24 of FIG. 3). In this step S24, after a silicon oxide film with a thickness of about 10 nm is formed on the main surface PS of the SOI substrate SB1, the silicon oxide film is processed by the anisotropic dry etching. In this manner, the insulating film IF1 as an offset spacer is formed on one side surface of the gate electrode GE, and the insulating film IF2 as an offset spacer is formed on the other side surface of the gate electrode GE.

Figure 16:
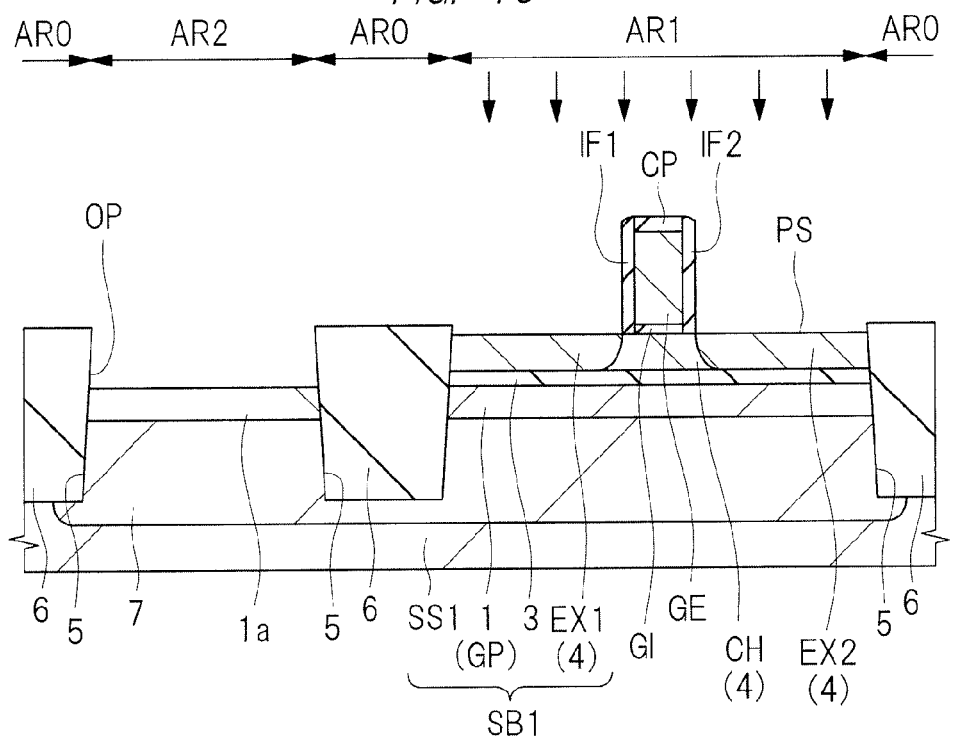
FIG. 16 is a cross-sectional view showing a principal part in the manufacturing process of the semiconductor device of the first embodiment.

Next, as shown in FIG. 16, the extension regions EX1 and EX2 are formed (step S25 of FIG. 3). In this step S25, an n type impurity such as phosphorus (P) or arsenic (As) is ion-implanted to the SOI layer 4 with using the gate electrode GE as a mask in the MISFET formation region AR1.

In the example shown in FIG. 16, in the MISFET formation region ART, an n type impurity such as phosphorus (P) or arsenic (As) is ion-implanted to the SOI layer 4 with using the gate electrode GE having the cap film OP formed on an upper surface and the insulating films IF1 and IF2 formed on both side surfaces as a mask. In this manner, the extension region EX1 as an n type semiconductor region is formed in a part of the SOI layer 4 located on a side opposite to the gate electrode GE with the insulating film IF1 interposed therebetween when seen in a plan view. Also, the extension region EX2 as an n type semiconductor region is formed in a part of the SOI layer 4 located on a side opposite to the gate electrode GE with the insulating film IF2 interposed therebetween when seen in a plan view. An n type impurity concentration in each of the extension regions EX1 and EX2 is, for example, about $2 \times 10^{19}$ cm$^{-3}$ or higher, preferably, about $1 \times 10^{20}$ cm$^{-3}$ or higher.

Note that the insulating films IF1 and IF2 sometimes do not have to be formed on both side surfaces of the gate electrode GE. Also, regardless of the presence and absence of the insulating film IF1, the n type extension region EX1 whose conductivity type is opposite to that of the well region 7 is formed in a part of the SOI layer 4 located on one side of the gate electrode GE when seen in a plan view. Further, regardless of the presence and absence of the insulating film IF2, the n type extension region EX2 whose conductivity type is opposite to that of the well region 7 is formed in a part of the SOI layer 4 located on the other side of the gate electrode GE when seen in a plan view.

However, if the insulating film IF1 is formed, an offset distance of an end position of the extension region EX1 on a side close to the gate electrode GE from the side surface of the gate electrode GE when seen in a plan view can be adjusted by adjusting the thickness of the insulating film IF1. Also, if the insulating film IF2 is formed, an offset distance of an end position of the extension region EX2 on a side close to the gate electrode GE from the side surface of the gate electrode GE when seen in a plan view can be adjusted by adjusting the thickness of the insulating film IF2.

Note that, when a p channel type MISFET is formed in another MISFET formation region different from the MISFET formation region AR1, a p type impurity is similarly ion-implanted with using the gate electrode as a mask. In this manner, in the different MISFET formation region, an extension region as a p type semiconductor region can be formed in the SOI layer formed in the same layer as the SOI layer 4 in the MISFET formation region AR1.

Figure 17:
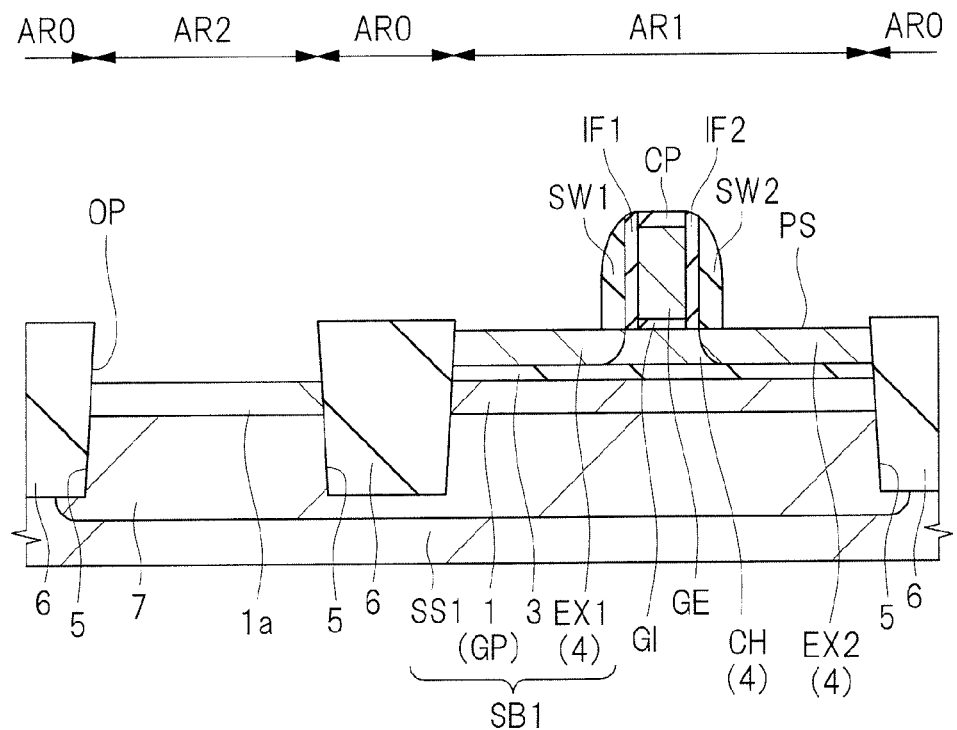
FIG. 17 is a cross-sectional view showing a principal part in the manufacturing process of the semiconductor device of the first embodiment.

Next, as shown in FIG. 17, the sidewall spacers SW1 and SW2 are formed (step S26 of FIG. 3). In this step S26, after a silicon nitride film with a thickness of, for example, about 30 nm is formed on the main surface of the SOI substrate SB1, the silicon nitride film is processed by anisotropic dry etching. In this manner, the sidewall spacer SW1 is formed on a side surface of the insulating film IF1 on a side opposite to the gate electrode GE, and the sidewall spacer SW2 is formed on a side surface of the insulating film IF2 on a side opposite to the gate electrode GE.

Figure 18:
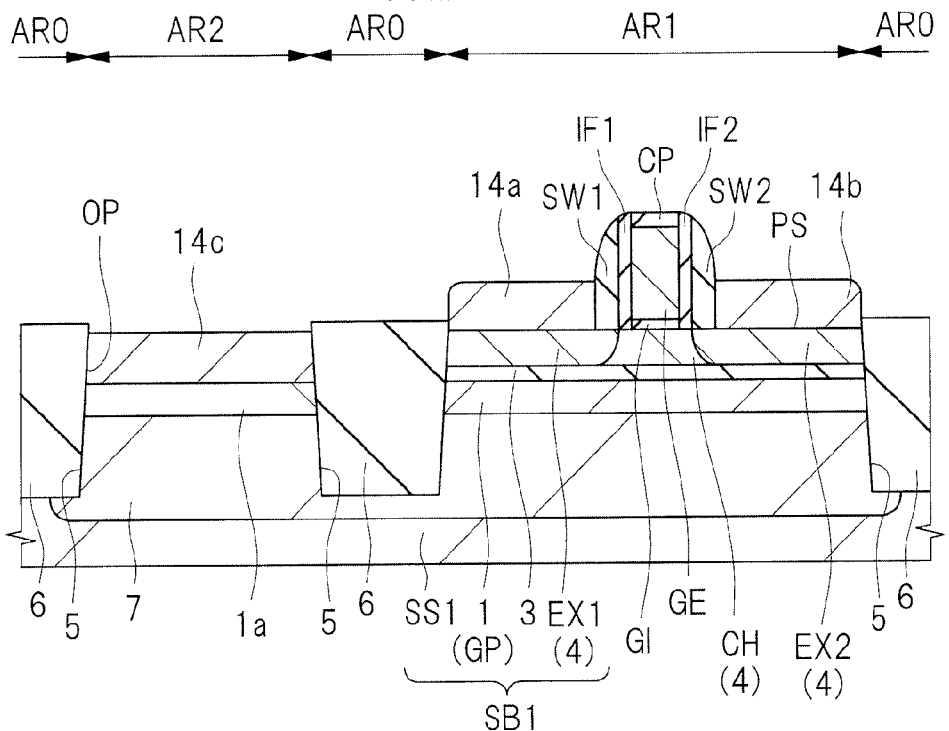
FIG. 18 is a cross-sectional view showing a principal part in the manufacturing process of the semiconductor device of the first embodiment.

Next, as shown in FIG. 18, semiconductor films 14a and 14b are formed (step S27 of FIG. 3). In this step S27, in the MISFET formation region AR1, the semiconductor film 14a made of an epitaxial silicon film with a thickness of, for example, about 20 nm is selectively formed on a part of the extension region EX1, that is, the SOI layer 4 exposed from the gate electrode GE, the insulating film IF1 and the sidewall spacer SW1. Also, in the MISFET formation region AR1, the semiconductor film 14b made of an epitaxial silicon film with a thickness of, for example, about 20 nm is selectively formed on a part of the extension region EX2, that is, the SOI layer 4 exposed from the gate electrode GE, the insulating film IF2 and the sidewall spacer SW2.

The semiconductor films 14a and 14b are formed by, for example, the CVD using monosilane gas as source gas after the surface of the SOI layer 4 is cleaned to remove a natural oxide film. At this time, a semiconductor film 14c is formed also on the semiconductor region 1a exposed at the bottom of the opening OP, that is, in the opening OP.

Note that the selective growth of the semiconductor films 14a and 14b is not indispensable and may be omitted depending on the requirement of element characteristics.

Figure 19:
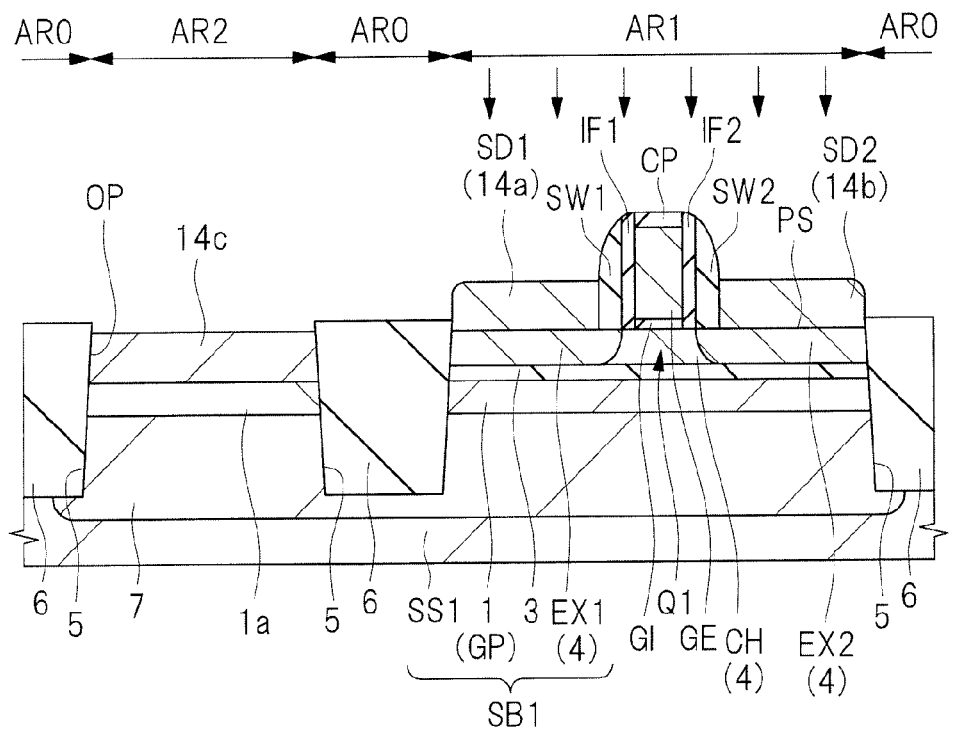
FIG. 19 is a cross-sectional view showing a principal part in the manufacturing process of the semiconductor device of the first embodiment.

Next, as shown in FIG. 19, the source/drain regions SD1 and SD2 are formed (step S28 of FIG. 3). In this step S28, in the MISFET formation region AR1, an n type impurity is introduced by ion implantation to the semiconductor films 14a and 14b, thereby forming the n type source/drain region SD1 made of the semiconductor film 14a to which an n type impurity has been introduced and the n type source/drain region SD2 made of the semiconductor film 14b to which an n type impurity has been introduced.

An n type impurity concentration in the source/drain region SD1 is set to be higher than the n type impurity concentration in the extension region EX1 and is, for example, about $5 \times 10^{20}$ cm$^{-3}$ or higher. Also, an n type impurity concentration in the source/drain region SD2 is set to be higher than the n type impurity concentration in the extension region EX2 and is, for example, about $5 \times 10^{20}$ cm$^{-3}$ or higher. Furthermore, the source/drain region SD1 may be formed not only in the semiconductor film 14a but also in the SOI layer 4, and the source/drain region SD2 may be formed not only in the semiconductor film 14b but also in the SOI layer 4.

In this manner, the n channel type MISFET Q1 made up of the channel region CH, the gate insulating film GI, the gate electrode GE, the insulating films IF1 and IF2, the extension regions EX1 and EX2, the sidewall spacers SW1 and SW2 and the source/drain regions SD1 and SD2 is formed on the SOI substrate SB1.

Note that, when a p channel type MISFET is formed in another MISFET formation region different from the MISFET formation region AR1, by ion-implanting a p type impurity with using a different resist film as a mask, p type source/drain regions can be formed in the different MISFET formation region.

Figure 20:
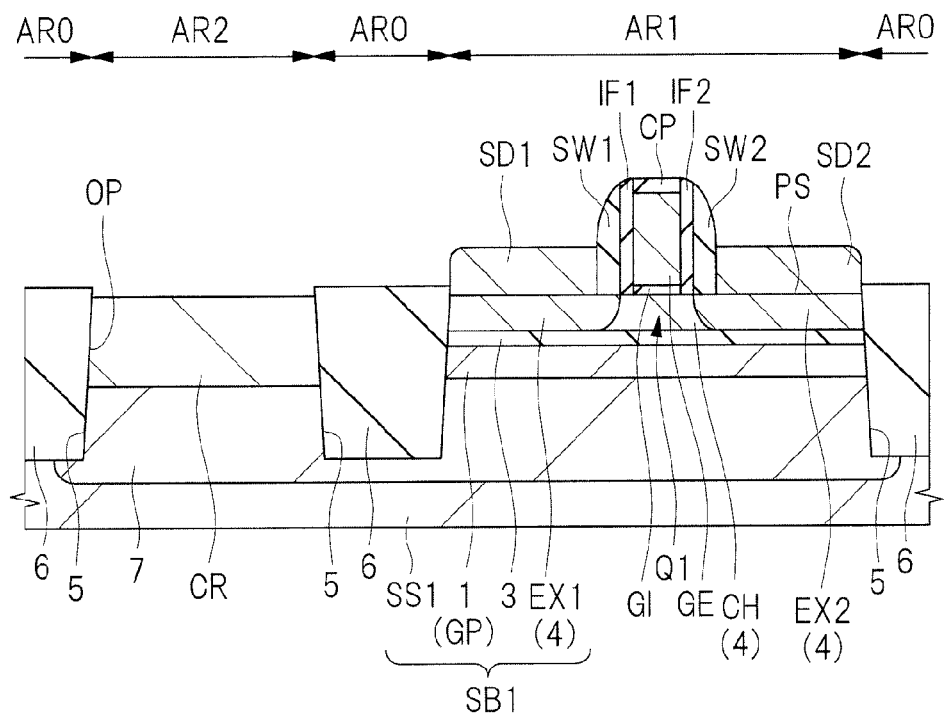
FIG. 20 is a cross-sectional view showing a principal part in the manufacturing process of the semiconductor device of the first embodiment.

Next, as shown in FIG. 20, the contact region CR is formed (step S29 of FIG. 3). In this step S29, a p type impurity is introduced by ion implantation to the semiconductor film 14c exposed at the bottom of the opening OP and the semiconductor region 1a located below the semiconductor film 14c with using a resist film having an opening formed in the region AR2 as a mask, thereby forming the p type contact region CR to which the p type impurity has been introduced. The conductivity type of the contact region CR can be the same as that of the well region 7 located below the contact region CR. Thereafter, though the illustration thereof is omitted in FIG. 20, the cap film CP is removed by wet etching or the like to expose the upper surface of the gate electrode GE.

Figure 21:
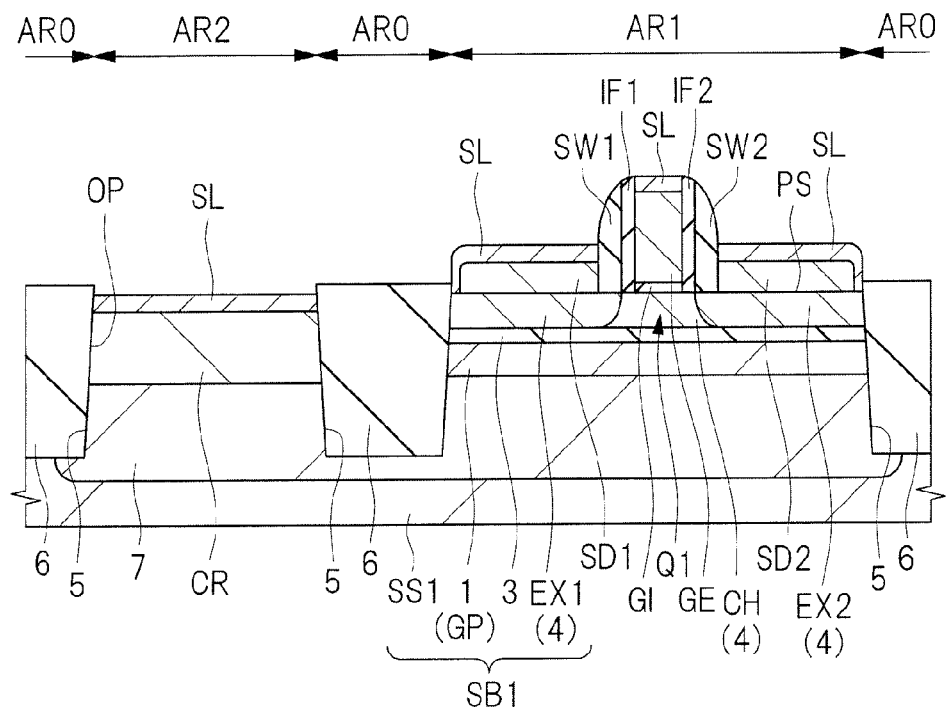
FIG. 21 is a cross-sectional view showing a principal part in the manufacturing process of the semiconductor device of the first embodiment.

Next, as shown in FIG. 21, the metal silicide layer SL is formed (step S30 of FIG. 3). In this step S30, in the MISFET formation region AR1, the metal silicide layer SL is formed by, for example, the silicide technology on the surfaces of the source/drain regions SD1 and SD2 and the gate electrode GE. Also, in the region AR2, the metal silicide layer SL is formed on the upper surface of the contact region CR.

Next, as shown in FIG. 1, in the MISFET formation region AR1, the interlayer insulating film IL1 is formed on the main surface PS of the SOI substrate SB1 so as to cover the n channel type MISFET Q1. Then, after forming the contact hole ON in the interlayer insulating film IL1 by dry etching using a resist film as a mask, the conductive plug PG is formed in the contact hole CN. In the MISFET formation region AR1, the contact hole CN and the plug PG are formed on each of the source/drain regions SD1 and SD2 and on the gate electrode GE (not shown). In the region AR2, the contact hole CN and the plug PG are formed on the contact region CR.

Thereafter, as shown in FIG. 1, after the insulating film IL2 made of, for example, a silicon oxide film is formed on the interlayer insulating film IL1 in which the plug PG has been buried, a wiring trench, that is, an opening is formed in the insulating film IL2, and the wiring ML1 as a first layer wiring is formed in the wiring trench. In the MISFET formation region AR1, the wiring ML1 is electrically connected to each of the source/drain regions SD1 and SD2, the gate electrode (not shown) and others through the plug PG. In the region AR2, the wiring ML1 is electrically connected to the contact region CR through the plug PG.

As the wiring ML1, a conductor film having copper (Cu) formed by, for example, the damascene technology as a main conductor film can be used, and as another aspect, a conductor film made of a patterned tungsten (W) film or aluminum (Al) film can also be used.

Thereafter, although a wiring of a further upper layer is formed on the insulating film IL2 in which the wiring ML1 has been buried, the illustration thereof is omitted. Through the process described above, the semiconductor device of the first embodiment including the SOI substrate SB1 and the MISFET Q1 is manufactured.

<Modified Example of Manufacturing Method of Semiconductor Device>

Next, a modified example of the manufacturing method of a semiconductor device of the first embodiment will be described. In this modified example, the semiconductor region for a ground plane region made of SiC is formed by the ion implantation instead of the epitaxial growth.

Figure 22:
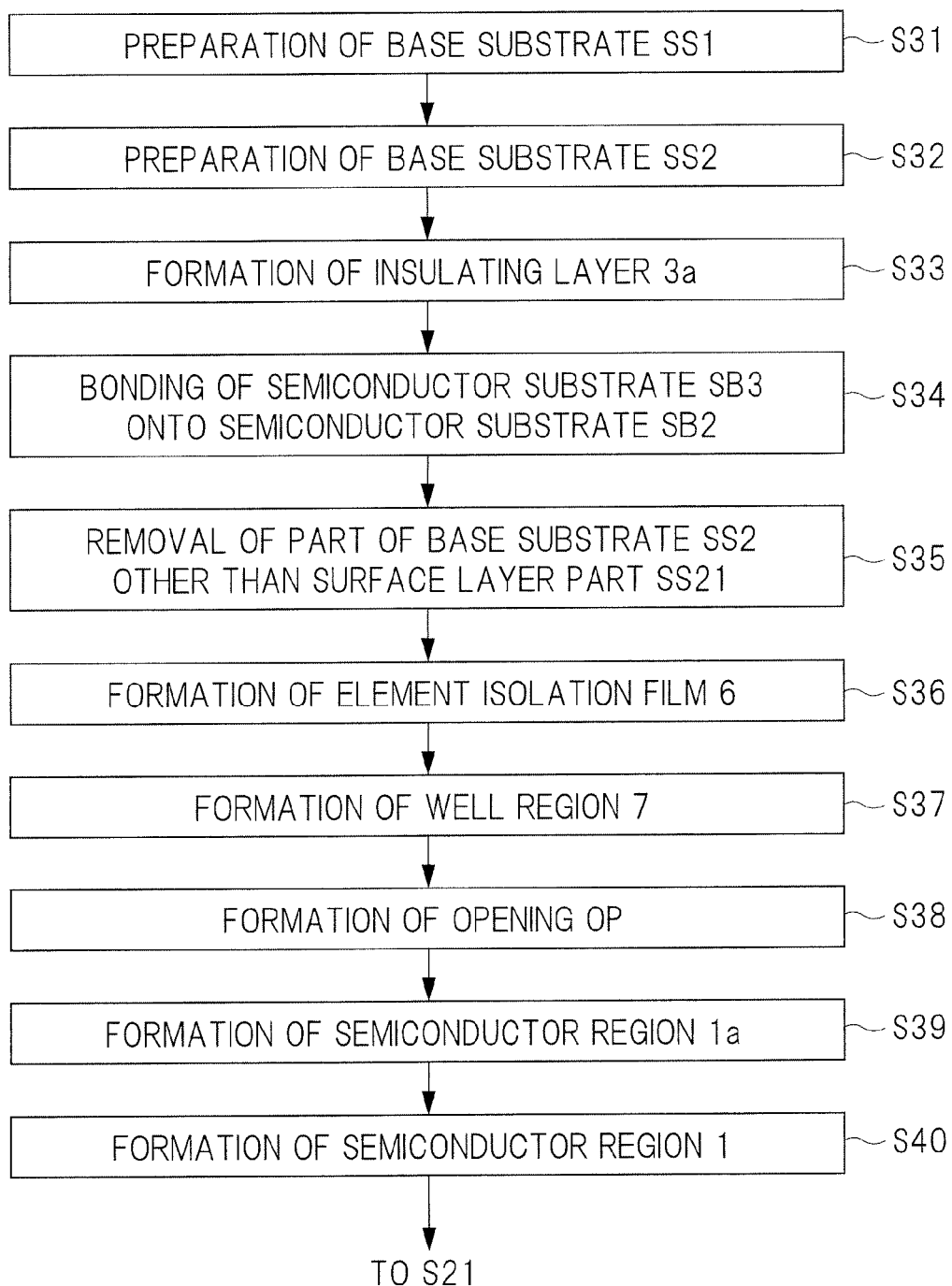
FIG. 22 is a process flow chart showing a part of a manufacturing process of a semiconductor device in a modified example of the first embodiment.

FIG. 22 is a process flow chart showing a part of the manufacturing process of the semiconductor device of the modified example of the first embodiment. FIGS. 23 to 27 are cross-sectional views showing a principal part in the manufacturing process of the semiconductor device of the modified example of the first embodiment.

Note that the process different from the manufacturing process of a semiconductor device of the first embodiment will be mainly described below.

At the beginning, a process of preparing the SOI substrate SB1 will be described with reference to FIGS. 23 to 25.

Figure 23:
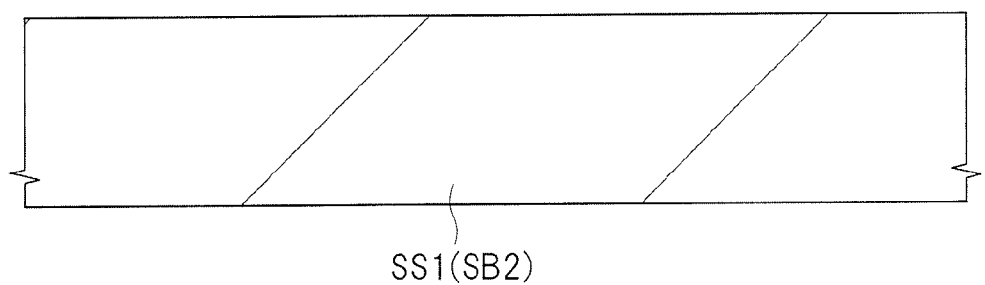
FIG. 23 is a cross-sectional view showing a principal part in the manufacturing process of the semiconductor device in the modified example of the first embodiment.
Figure 24:
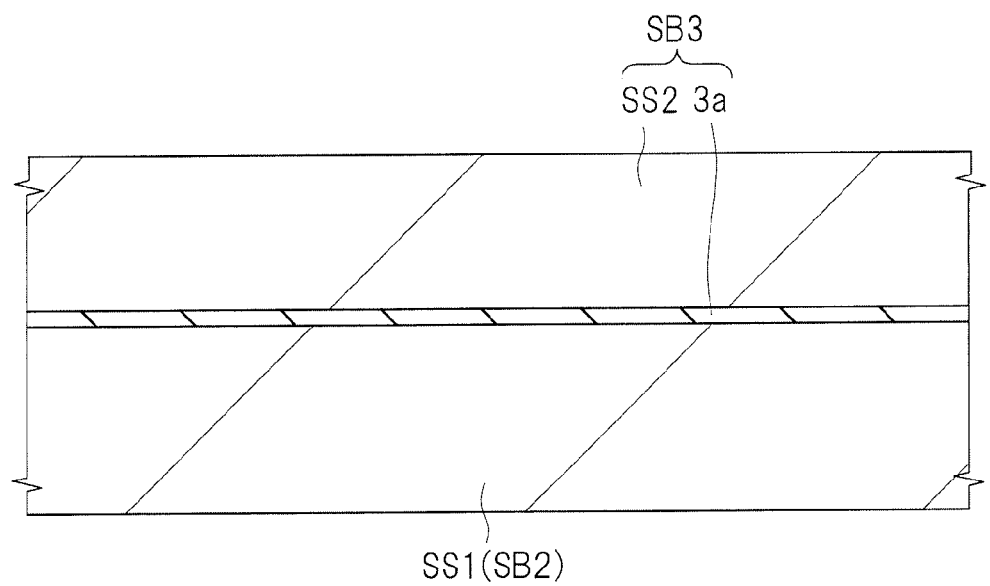
FIG. 24 is a cross-sectional view showing a principal part in the manufacturing process of the semiconductor device in the modified example of the first embodiment.

First, as shown in FIG. 23, the base substrate SS1 is prepared by performing the same process as the step S11 of FIG. 2 (step S31 of FIG. 22). However, in this modified example, unlike the first embodiment, the process similar to the step S12 of FIG. 2 is not performed after the step S31 and the semiconductor region 1 made of, for example, an SiC film is not epitaxially grown on the base substrate SS1. Therefore, in this modified example, unlike the first embodiment, a semiconductor substrate SB2 made up of only the base substrate SS1 is prepared.

Next, by performing the same process as the step S13 and the step S14 of FIG. 2 (step S32 and step S33 of FIG. 22), the semiconductor substrate SB3 made up of the base substrate SS2 and the insulating layer 3a is prepared as shown in FIG. 5. Next, by performing the same process as the step S15 of FIG. 2 (step S34 of FIG. 22), the semiconductor substrate SB3 is bonded onto the semiconductor substrate SB2 as shown in FIG. 24. In this step S34, in the state where the insulating layer 3a faces the base substrate SS1, the semiconductor substrate SB3 and the semiconductor substrate SB2 are pressure-bonded so that the insulating layer 3a comes into contact with the base substrate SS1. Then, the semiconductor substrate SB3 and the semiconductor substrate SB2 are retained at a high temperature of, for example, 1000° C. and are subjected to a thermal treatment. In this manner, the semiconductor substrate SB3 is boned onto the semiconductor substrate SB2. At this time, the insulating layer 3a and the base substrate SS1 are joined.

Figure 25:
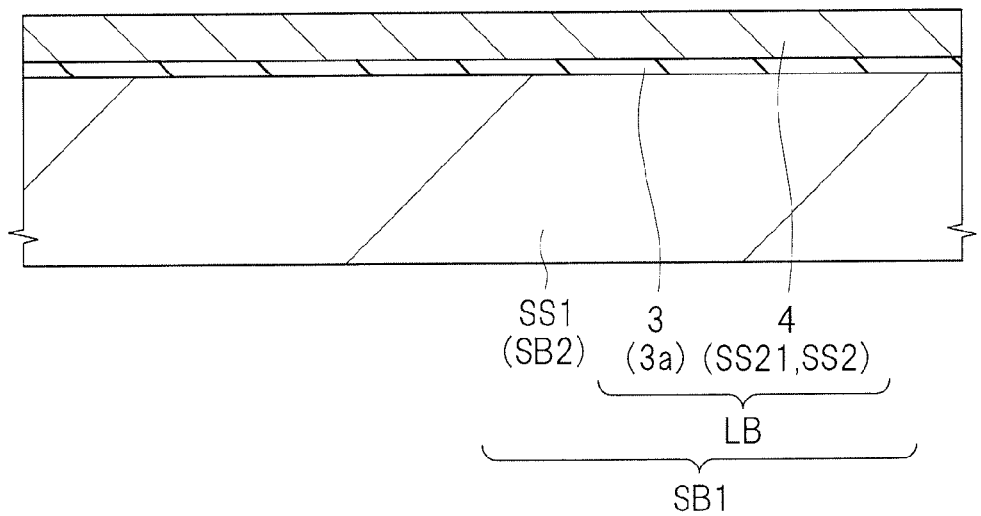
FIG. 25 is a cross-sectional view showing a principal part in the manufacturing process of the semiconductor device in the modified example of the first embodiment.

Next, by performing the same process as the step S16 of FIG. 2 (step S35 of FIG. 22), the base substrate SS2 of the semiconductor substrate SB3 bonded onto the semiconductor substrate SB2 is removed except the surface layer part SS21 on a side close to the semiconductor substrate SB2 as shown in FIG. 25.

In this manner, the stacked body LB made up of the BOX layer 3 made of the insulating layer 3a and the SOI layer 4 as a semiconductor layer made of the surface layer part SS21 disposed on the insulating layer 3a is transferred onto the base substrate SS1, that is, onto the semiconductor substrate SB2. Thus, the SOI substrate SB1 including the base substrate SS1, the BOX layer 3 formed on the base substrate SS1 and the SOI layer 4 formed on the BOX layer 3 is prepared.

Next, a process of fabricating the MISFET Q1 will be described with reference to FIGS. 26 and 27.

Figure 26:
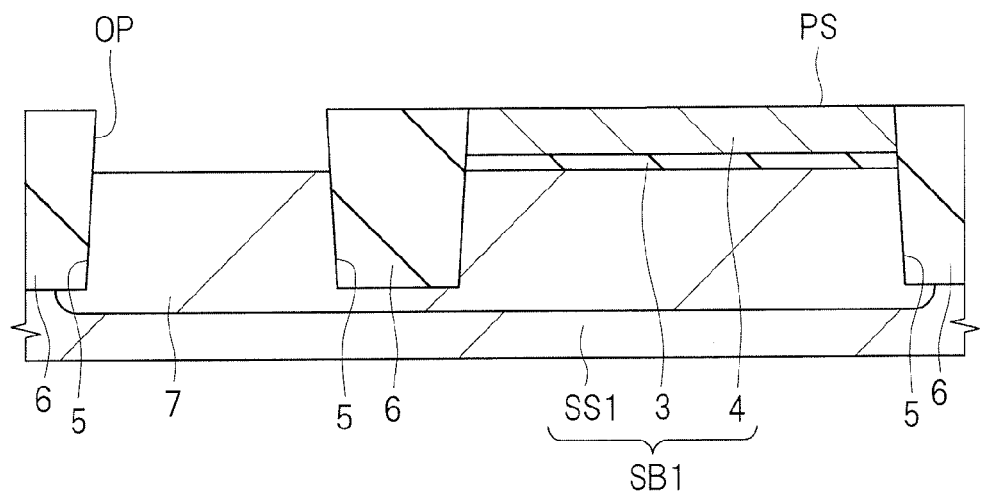
FIG. 26 is a cross-sectional view showing a principal part in the manufacturing process of the semiconductor device in the modified example of the first embodiment.

First, by performing the same process as the steps S17 to S19 of FIG. 2 (steps S36 to S38 of FIG. 22), the element isolation films 6, the p type well region 7 and the opening OP are formed as shown in FIG. 26.

Figure 27:
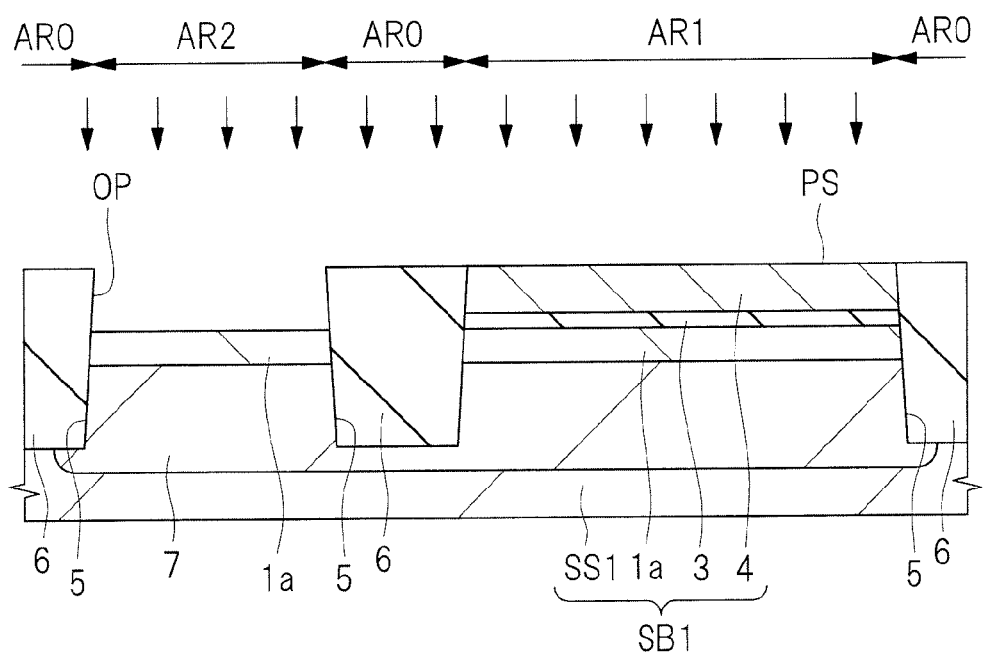
FIG. 27 is a cross-sectional view showing a principal part in the manufacturing process of the semiconductor device in the modified example of the first embodiment.

Next, as shown in FIG. 27, the semiconductor region 1a is formed (step S39 of FIG. 22). In this step S39, for example, carbon (C) is introduced to the p type well region 7, that is, the base substrate SS1 by the ion implantation with using a resist film having openings formed in the MISFET formation regions AR1 and AR2 as a mask. In this manner, the semiconductor region 1a for the ground plane region made of, for example, silicon carbide (SiC) is formed in the p type well region 7, that is, in the upper layer part of the base substrate SS1.

Preferably, x in the case where a composition formula of silicon carbide (SiC) is expressed as $Si_{1-x}C_x$, that is, a composition ratio of carbon with respect to a sum of silicon (Si) and carbon (C) is 0.01 or more. When x is 0.01 or more, the impurity diffusion coefficient in the semiconductor region 1a can be reliably reduced in comparison with the case where the semiconductor region 1a is made of Si.

More preferably, x is 0.01 to 0.10. When x is 0.10 or less, the semiconductor region 1a made of SiC can be easily formed by ion-implanting carbon into the well region 7, that is, the upper layer part of the base substrate SS1.

Still more preferably, x is 0.01 to 0.014. When x is 0.014 or less, since the difference in lattice constant between the crystal lattice of Si in the well region 7, that is, the base substrate SS1 and the crystal lattice of SiC in the semiconductor region 1a becomes small, it is possible to prevent or suppress the occurrence of strain in the semiconductor region 1a made of SiC.

Note that the process of forming the semiconductor region 1a can be performed at any time after preparing the base substrate SS1 by performing the step S31 and before forming the semiconductor region 1 in the step S40 described later.

Also, a mask similar to the mask for forming the p type well region 7 can be used as the mask for forming the semiconductor region 1a. Thus, since the number of masks is not increased, the manufacturing cost can be suppressed.

In addition, since carbon can be selectively ion-implanted, the degree of freedom in the design is higher in comparison with the above-described case in which the semiconductor region 1a is epitaxially grown. In the case where carbon is ion-implanted, there is a possibility that crystal strain is enlarged and unnecessary strain may be caused. Therefore, the case where carbon is to be implanted into only a necessary region such as the MISFET formation region AR1 is also conceivable. Namely, in this modified example, it is also possible to ion-implant carbon into only the MISFET formation region AR1 without ion-implanting carbon into the region AR2 and the region AR3 (see FIG. 1).

Next, by performing the same process as the step S20 of FIG. 2 (step S40 of FIG. 22), the semiconductor region 1 is formed in the same manner as that shown in FIG. 11.

Thereafter, by performing the same process as the steps S21 to S30 of FIG. 3, the semiconductor device of the first embodiment is manufactured as shown in FIG. 1.

<Control of Threshold Voltage of MISFET>

Next, control of the threshold voltage of the MISFET in the semiconductor device of the first embodiment will be described in comparison with control of the threshold voltage of the MISFET in the semiconductor device of a comparative example 1.

Figure 28:
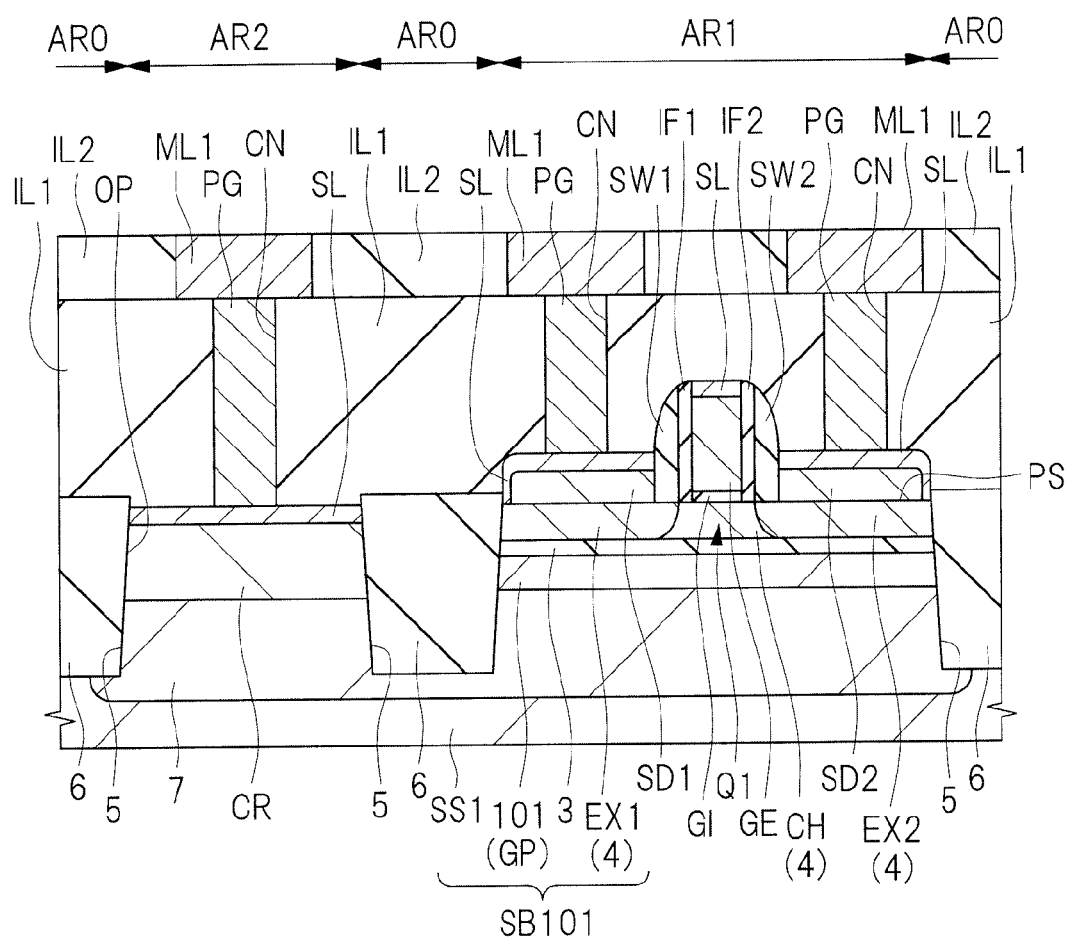
FIG. 28 is a cross-sectional view showing a principal part of a semiconductor device of a comparative example 1.

FIG. 28 is a cross-sectional view showing a principal part of a semiconductor device of the comparative example 1. As shown in FIG. 28, the semiconductor device of the comparative example 1 includes an SOI substrate SB101 as a semiconductor substrate and a MISFET Q1 as a field effect transistor formed on the SOI substrate SB101.

The SOI substrate SB101 in the comparative example 1 includes the base substrate SS1, a semiconductor region 101 as a ground plane region GP, the BOX layer 3 and the SOI layer 4 like the SOI substrate SB1 in the first embodiment. However, the semiconductor region 101 as a ground plane region GP in the SOI substrate SB101 in the comparative example 1 is made of silicon unlike the semiconductor region 1 as a ground plane region GP in the SOI substrate SB1 in the first embodiment.

Meanwhile, the MISFET Q1 in the comparative example 1 can be the same as the MISFET Q1 in the first embodiment.

Both of the MISFET Q1 of the first embodiment and the MISFET Q1 of the comparative example 1 are similarly formed by using the SOTB technology and the FD-SOI technology. Namely, in both of the first embodiment and the comparative example 1, no impurity is introduced to the SOI layer 4 located below the gate electrode GE of the MISFET Q1, that is, the channel region CH or the impurity concentration of the channel region CH is extremely low, and the so-called dopant-free channel is formed. When the MISFET Q1 has the channel region CH as the dopant-free channel mentioned above, there is a fear that the absolute value of the threshold voltage Vth decreases, and thus the adjustment to increase the absolute value of the threshold voltage Vth is necessary.

In both of the MISFET Q1 of the first embodiment and the MISFET Q1 of the comparative example mentioned above, the threshold voltage Vth is adjusted by a work function of the conductive film included in the gate electrode GE or by the build-in potential Vbi of the semiconductor region 101 or the semiconductor region 1 serving as the ground plane region corresponding to a back gate. However, when a polycrystalline silicon film is used as a conductive film included in the gate electrode GE, since the work function of the conductive film is affected by the conditions of ion implantation in forming source/drain regions, it is difficult to adjust the work function of the conductive film. Therefore, in both of the MISFET Q1 of the first embodiment and the MISFET Q1 of the comparative example 1, the adjustment of the threshold voltage Vth is desirably made by adjusting the built-in potential Vbi of the semiconductor region 101 or the semiconductor region 1 serving as the ground plane region GP.

Here, the built-in potential Vbi of the semiconductor region 101 or the semiconductor region 1 serving as the ground plane region GP is given by the following expression (1).

$$Vbi=(kT/q)\ln(Na \cdot Nd/ni^2) \qquad \text{Expression (1)}$$

In the expression (1), k denotes Boltzmann constant, T denotes temperature, q denotes unit potential, Na denotes acceptor concentration, Nd denotes donor concentration and ni denotes intrinsic carrier density. Also, the acceptor concentration Na is equal to the p type impurity concentration in the ground plane region GP and the donor concentration Nd is equal to the n type impurity concentration in the ground plane region GP.

As indicated by the expression (1), when the impurity concentration in the semiconductor region 101 or the semiconductor region 1 serving as the ground plane region GP is low, the absolute value of the built-in potential Vbi also decreases.

Figure 29:
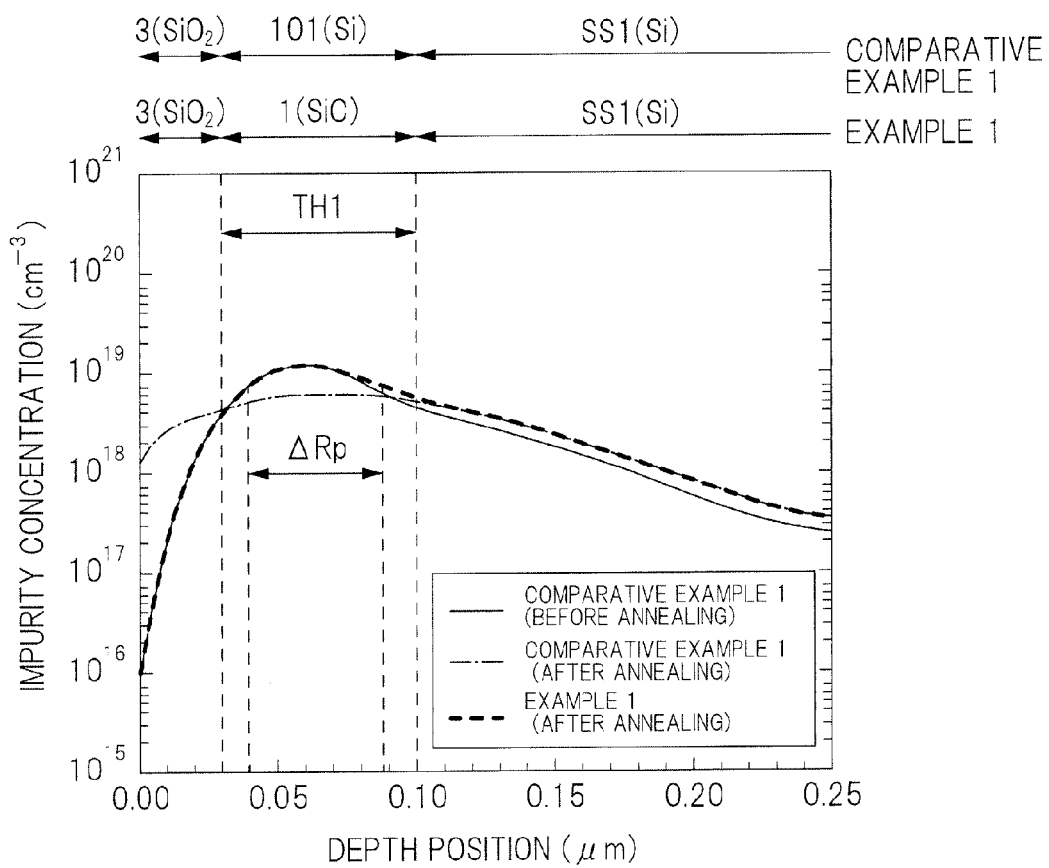
FIG. 29 is a graph showing an impurity concentration distribution in a thickness direction of an SOI substrate.

FIG. 29 is a graph showing an impurity concentration distribution in a thickness direction of an SOI substrate. In FIG. 29, the impurity concentration distributions of boron as a p type impurity in each of the BOX layer 3, the semiconductor region 101 or the semiconductor region 1 serving as the ground plane region GP and the base substrate SS1, that is, the well region 7 are obtained by calculation for the comparative example 1 and an example 1 as one example of the first embodiment. Note that the BOX layer 3 is made of silicon oxide (SI02), the semiconductor region 1 is made of silicon carbide (SiC), and the semiconductor region 101 and the base substrate SS1 are made of silicon (Si).

The horizontal axis of FIG. 29 represents a depth position when a depth position of the upper surface of the BOX layer 3 is defined as 0, and the vertical axis of FIG. 29 represents an impurity concentration of boron as a p type impurity. In FIG. 29, the concentration distribution after the ion implantation and before the activation annealing in the comparative example 1 is designated as "comparative example 1 (before annealing)", and the concentration distribution after the ion implantation and the activation annealing in the comparative example 1 is designated as "comparative example 1 (after annealing)". Also, the concentration distribution after the ion implantation and the activation annealing in the example 1 is designated as "example 1 (after annealing)". In addition, the concentration distribution after the ion implantation and before the activation annealing in the example 1 is assumed to be the same as the concentration distribution after the ion implantation and before the activation annealing in the comparative example 1.

Note that, in the calculation of the impurity concentration distribution in FIG. 29, the thermal treatment temperature of the activation annealing is set to 1000° C. and the diffusion coefficient of boron in silicon at the thermal treatment temperature is set to $2\times10^{-14}$ cm$^2$ sec$^{-1}$. Also, the composition ratio of silicon carbide is set to $Si_{0.99}C_{0.01}$, and the diffusion coefficient of boron at the above-mentioned thermal treatment temperature of the activation annealing in the silicon carbide with the composition ratio is set to $2\times10^{-16}$ cm$^2$ sec$^{-1}$.

In the comparative example 1, at the ion implantation before performing the activation annealing, the impurity concentration distribution in the depth direction, that is, in the thickness direction of the semiconductor region 101 has a peak between the upper surface of the semiconductor region 101 and the lower surface of the semiconductor region 101. Then, an impurity is ion-implanted so that the thickness of the semiconductor region 101 is larger than a half-value width of the peak. Further, as described above, also in the example 1, the impurity concentration distribution in the depth direction, that is, in the thickness direction of the semiconductor region 1 before performing the activation annealing is the same as that of the comparative example 1.

Since the semiconductor region 101 is made of Si in the comparative example 1, when performing the activation annealing after the ion implantation, the ion-implanted impurity is easily diffused. Therefore, in the comparative example 1, after performing the activation annealing, the impurity concentration distribution in the depth direction, that is, in the thickness direction of the semiconductor region 101 still has a peak between the upper surface of the semiconductor region 101 and the lower surface of the semiconductor region 101, but the peak height in the impurity concentration distribution is lowered and the half-value width of the peak expands. As a result, in the comparative example 1, after performing the activation annealing, the average value of impurity concentration in the entire ground plane region GP decreases. Consequently, since the absolute value of the built-in potential Vbi of the ground plane region GP decreases as described with reference to the expression (1) above, the range capable of adjusting the threshold voltage Vth is narrowed and the performance of the semiconductor device is degraded.

Also, when the impurity concentration in the semiconductor region 101 is low, the resistance of the semiconductor region 101 becomes high. Therefore, when a substrate potential Vb is applied to the well region 7 through the plug PG and the contact region CR, due to the reason that the potential of a part of the semiconductor region 101 in contact with the BOX layer 3 is not equal to the substrate potential Vb, the potential of the ground plane region GP made of the semiconductor region 101 cannot be adjusted with high accuracy.

Further, in the comparative example 1, when performing the activation annealing, the impurity ion-implanted into the semiconductor region 101 is diffused to the side close to the BOX layer 3, so that the impurity concentration in a part of the semiconductor region 101 in contact with the BOX layer 3 is increased. As a result, the impurity ion-implanted into the semiconductor region 101 is diffused to the BOX layer 3 and the insulation property of the BOX layer 3 is degraded. Consequently, in the case where the ground plane region GP made of the semiconductor region 101 is used as a back gate and the BOX layer 3 is used as a gate insulating film for the back gate, the reliability of the BOX layer 3 as the gate insulating film is deteriorated.

On the other hand, in the example 1, since the semiconductor region 1 is made of SiC having an impurity diffusion coefficient smaller than an impurity diffusion coefficient of Si at the temperature of about 1000° C., when the activation annealing is performed after the ion implantation, the ion-implanted impurity is less likely to be diffused. Therefore, in the example 1, after performing the activation annealing, the impurity concentration distribution in the depth direction, that is, in the thickness direction of the semiconductor region 1 shows almost no change from the impurity concentration distribution before performing the activation annealing. In other words, in the example 1, since the impurity is less likely to be diffused when performing the activation annealing, the impurity concentration distribution just after the ion implantation is maintained even after performing the activation annealing.

More specifically, in the example 1, even after the activation annealing is performed, the impurity concentration distribution in the depth direction, that is, in the thickness direction of the semiconductor region 1 still has a peak between the upper surface of the semiconductor region 1 and the lower surface of the semiconductor region 1, and the thickness TH1 of the semiconductor region 1 is larger than a half-value width ΔRp of the peak. Alternatively, preferably, the impurity concentration distribution in the thickness direction of the semiconductor region 1 has a peak between the upper surface of the semiconductor region 1 and the lower surface of the semiconductor region 1, and both of the impurity concentration of the upper surface of the semiconductor region 1 and the impurity concentration of the lower surface of the semiconductor region 1 are lower than the half of the impurity concentration at the peak.

In this manner, since a part having at least the impurity concentration equal to or higher than ½ of the impurity concentration at the peak, that is, the peak value is included in the semiconductor region 1, the impurity concentration in the semiconductor region 1 can be reliably increased. Thus, it is possible to prevent or suppress the decrease of the average value of the impurity concentration in the entire ground plane region GP after the activation annealing is performed. Therefore, as described with reference to the expression (1) above, it is possible to prevent or suppress the decrease of the absolute value of the built-in potential Vbi, so that the range capable of adjusting the threshold voltage Vth can be expanded and the performance of the semiconductor device can be improved.

Preferably, a part having at least the impurity concentration equal to or higher than ½ of the peak value in the impurity concentration distribution is included in the semiconductor region 1. Alternatively, preferably, the thickness TH1 of the semiconductor region 1 is larger than twice the half-value width ΔRp of the peak. In this manner, it is possible to more reliably prevent or suppress the decrease of the average value of the impurity concentration in the entire ground plane region GP after performing the activation annealing.

Also, when the impurity concentration in the semiconductor region 1 is high, the resistance of the semiconductor region 1 becomes low. Therefore, when a substrate potential Vb is applied to the well region 7 through the plug PG and the contact region CR, the potential of a part of the semiconductor region 1 in contact with the BOX layer 3 becomes equal to the substrate potential Vb, and the potential of the ground plane region GP made of the semiconductor region 1 can be adjusted with high accuracy.

Further, in the example 1, when the activation annealing is performed, the impurity ion-implanted into the semiconductor region 1 is less likely to be diffused to the side close to the BOX layer 3, so that the impurity concentration in a part of the semiconductor region 1 in contact with the BOX layer 3 is less likely to be increased. As a result, since the impurity ion-implanted into the semiconductor region 1 is not diffused to the BOX layer 3, the insulating property of the BOX layer 3 is improved. Thus, when the BOX layer 3 is used as the gate insulating film for the back gate, the reliability of the BOX layer 3 as the gate insulating film is improved.

<Main Feature and Effect of Present Embodiment>

In the first embodiment, the semiconductor device includes the SOI substrate SB1 and the MISFET Q1 formed on the SOI substrate SB1. The SOI substrate SB1 has the base substrate SS1, the ground plane region GP formed on the base substrate SS1, the BOX layer 3 formed on the ground plane region GP and the SOI layer 4 formed on the BOX layer 3. The base substrate SS1 is made of Si and the ground plane region GP includes the p type semiconductor region 1 made of SiC.

For example, the diffusion coefficient of a p type impurity such as boron in SiC is smaller than the diffusion coefficient of a p type impurity in Si. Thus, it is possible to prevent or suppress the impurity introduced to the semiconductor region 1 from being diffused due to the thermal treatment or the like to decrease the impurity concentration in the semiconductor region 1. Therefore, it is possible to prevent or suppress the decrease of the absolute value of the built-in potential Vbi in the ground plane region GP including the semiconductor region 1, so that the range capable of adjusting the threshold voltage Vth is expanded and the performance of the semiconductor device can be improved.

Also, it is possible to prevent or suppress the increase of the electric resistance of the semiconductor region 1, and when applying the substrate potential Pb, the potential in the ground plane region GP including the semiconductor region 1 can be made substantially equal to the applied substrate potential Vb. Further, it is possible to prevent or suppress the impurity introduced to the semiconductor region 1 from being diffused to the BOX layer 3, and the reliability of the BOX layer 3 as a gate insulating film can be improved. Therefore, it is possible to improve the performance of the semiconductor device including the SOI substrate SB1 and the MISFET Q1 formed on the SOI substrate SB1.

In addition, with the miniaturization of the MISFET, the short-channel effect appears or the uniformity in threshold voltage is degraded, so that the performance of the semiconductor device is likely to be degraded. However, even in such a case, according to the first embodiment, the impurity diffusion coefficient in the semiconductor region 1 can be reduced, and it is possible to prevent or suppress the decrease of the impurity concentration in the semiconductor region 1. Therefore, according to the first embodiment, the performance of the semiconductor device can be improved even when the MISFET is miniaturized.

As described above, the semiconductor device of the first embodiment can be applied also to the case where the conductivity type of respective semiconductor regions such as the well region 7, the ground plane region GP, the channel region CH, the extension regions EX1 and EX2 and the source/drain regions SD1 and SD2 is exchanged between a p type and an n type. More specifically, the semiconductor device of the first embodiment can be applied also to the semiconductor device including a p channel type MISFET as a MISFET. In addition, also when the semiconductor device of the first embodiment is applied to a semiconductor device including a p channel type MISFET, the same effects as those of the case where it is applied to a semiconductor device including an n channel type MISFET can be achieved.

Second Embodiment

In the semiconductor device of the first embodiment, the ground plane region is provided between the base substrate and the BOX layer of the SOI substrate, and the ground plane region includes a semiconductor region made of SiC. Meanwhile, in the semiconductor device of the second embodiment, the ground plane region is provided between the base substrate and the BOX layer of the SOI substrate, but the ground plane region includes a semiconductor region made of SiC and a semiconductor region made of Si and formed on the semiconductor region made of SiC.

<Structure of Semiconductor Device>

Figure 30:
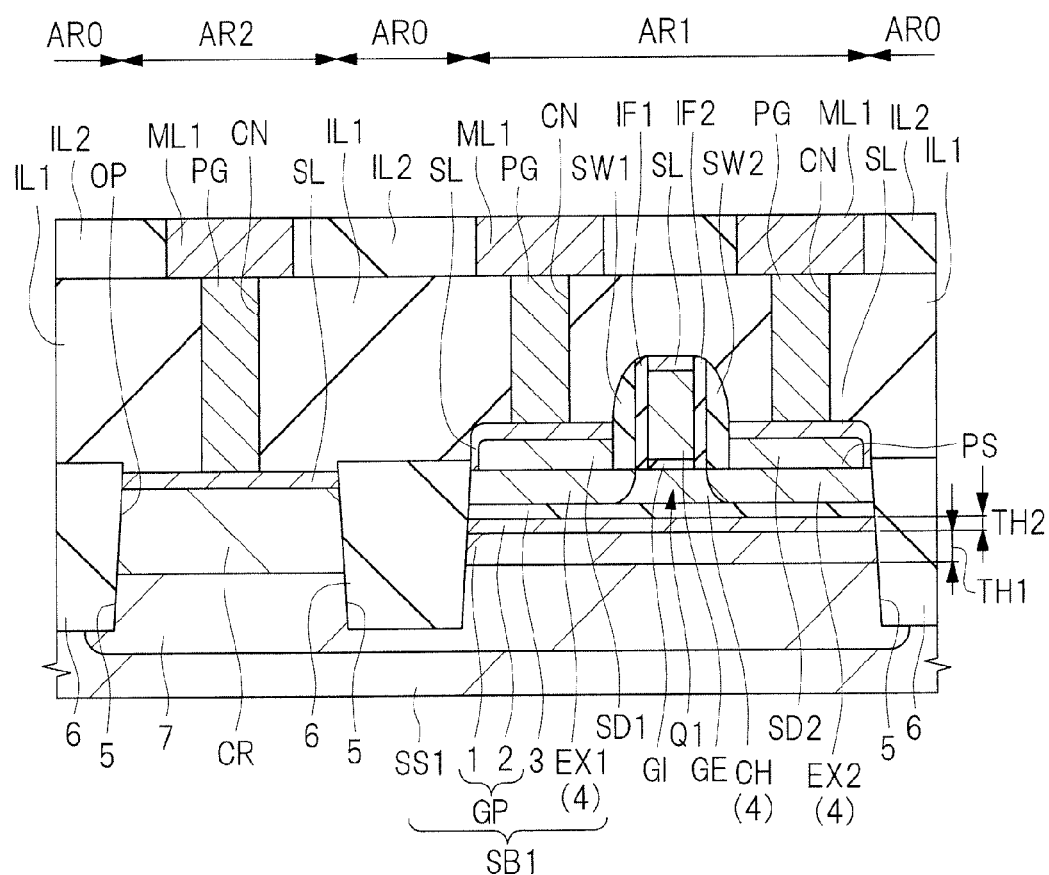
FIG. 30 is a cross-sectional view showing a principal part of a semiconductor device of the second embodiment.

FIG. 30 is a cross-sectional view showing a principal part of the semiconductor device of the second embodiment. As shown in FIG. 30, the semiconductor device of the second embodiment includes the SOI substrate SB1 as a semiconductor substrate and the MISFET Q1 as a field effect transistor formed on the SOI substrate SB1.

The SOI substrate SB1 in the second embodiment includes the base substrate SS1, the ground plane region GP, the BOX layer 3 and the SOI layer 4 like the SOI substrate SB1 in the first embodiment. However, the ground plane region GP in the SOI substrate SB1 of the second embodiment includes the semiconductor region 1 formed on the base substrate SS1 and made of silicon carbide (SiC) and a semiconductor region 2 formed on the semiconductor region 1 and made of silicon (Si) unlike the ground plane region GP in the SOI substrate SB1 of the first embodiment. More specifically, the semiconductor device of the second embodiment has the same structure as the semiconductor device of the first embodiment shown in FIG. 1 except the ground plane region GP.

In the second embodiment, the ground plane region GP includes the semiconductor region 1 and the semiconductor region 2 formed on the semiconductor region 1. Therefore, the BOX layer 3 is formed on the semiconductor region 1 via the semiconductor region 2.

The semiconductor region 1 is made of, for example, a silicon carbide (SiC) film and has an impurity diffusion coefficient smaller than that of the base substrate SS1 made of a silicon (Si) substrate like the semiconductor region 1 in the first embodiment. Also, when the MISFET Q1 is an n channel type MISFET, a p type impurity such as boron (B) is introduced to the semiconductor region 1 and the semiconductor region 1 is a p type semiconductor region like the semiconductor region 1 in the first embodiment. Thus, when performing the activation annealing after the ion implantation is performed to the semiconductor region 1, the impurity is less likely to be diffused in the semiconductor region 1 made of SiC. Therefore, the impurity concentration distribution just after the ion implantation is maintained even after performing the activation annealing. The thickness TH1 of the semiconductor region 1 is, for example, about 70 nm.

Preferably, the semiconductor region 1 made of SiC is epitaxially grown on the base substrate SS1 made of Si. Thus, the thickness TH1 of the semiconductor region 1 can be increased in comparison with the case where the semiconductor region 1 made of SiC is formed by ion-implanting carbon (C) to an upper layer part of the base substrate SS1 made of Si. Also, when the semiconductor region 1 is formed by the epitaxial growth, the amount of carbon introduced to the semiconductor region 1 can be easily increased in comparison with the case where the semiconductor region 1 is formed by the ion implantation.

Note that, like the first embodiment, x in the case where a composition formula of silicon carbide (SiC) is expressed as that is, a composition ratio of carbon with respect to a sum of silicon (Si) and carbon (C) is 0.01 or more. Also, more preferably, x is 0.01 to 0.10, and still more preferably, x is 0.01 to 0.014 like the first embodiment. Further, like the first embodiment, preferably, the concentration distribution of an n type impurity in the thickness direction of the semiconductor region 1 has a peak between the upper surface of the semiconductor region 1 and the lower surface of the semiconductor region 1, and the thickness TH1 of the semiconductor region 1 is larger than a half-value width ΔRp of the peak. Alternatively, preferably, the impurity concentration distribution in the thickness direction of the semiconductor region 1 has a peak between the upper surface of the semiconductor region 1 and the lower surface of the semiconductor region 1, and both of the impurity concentration of the upper surface of the semiconductor region 1 and the impurity concentration of the lower surface of the semiconductor region 1 are lower than the half of the impurity concentration at the peak.

On the other hand, the semiconductor region 2 is made of, for example, a silicon (Si) film, and has an impurity diffusion coefficient larger than the impurity diffusion coefficient of the semiconductor region 1 made of, for example, an SiC film. Thus, since the impurity from the semiconductor region 1 made of SiC is diffused into the semiconductor region 2 made of Si, the impurity concentration in apart of the ground plane region GP on a side close to the BOX layer 3 can be kept high while maintaining the impurity concentration distribution in the semiconductor region 1 made of SiC even after performing the activation annealing. A thickness TH2 of the semiconductor region 2 is, for example, about 10 nm.

Preferably, the thickness TH2 of the semiconductor region 2 is smaller than the thickness TH1 of the semiconductor region 1. In this manner, the impurity concentration in the semiconductor region 2 can be increased while sufficiently securing the effect of maintaining the impurity concentration distribution in the semiconductor region 1 made of SiC after performing the activation annealing.

Also, the semiconductor region 2 is made of, for example, a silicon (Si) film and thus has a high degree of affinity for the BOX layer 3 made of, for example, a silicon oxide film. Therefore, it is possible to suppress the occurrence of an interface state near the interface between the ground plane region GP and the BOX layer 3.

<Manufacturing Method of Semiconductor Device>

Figure 31:
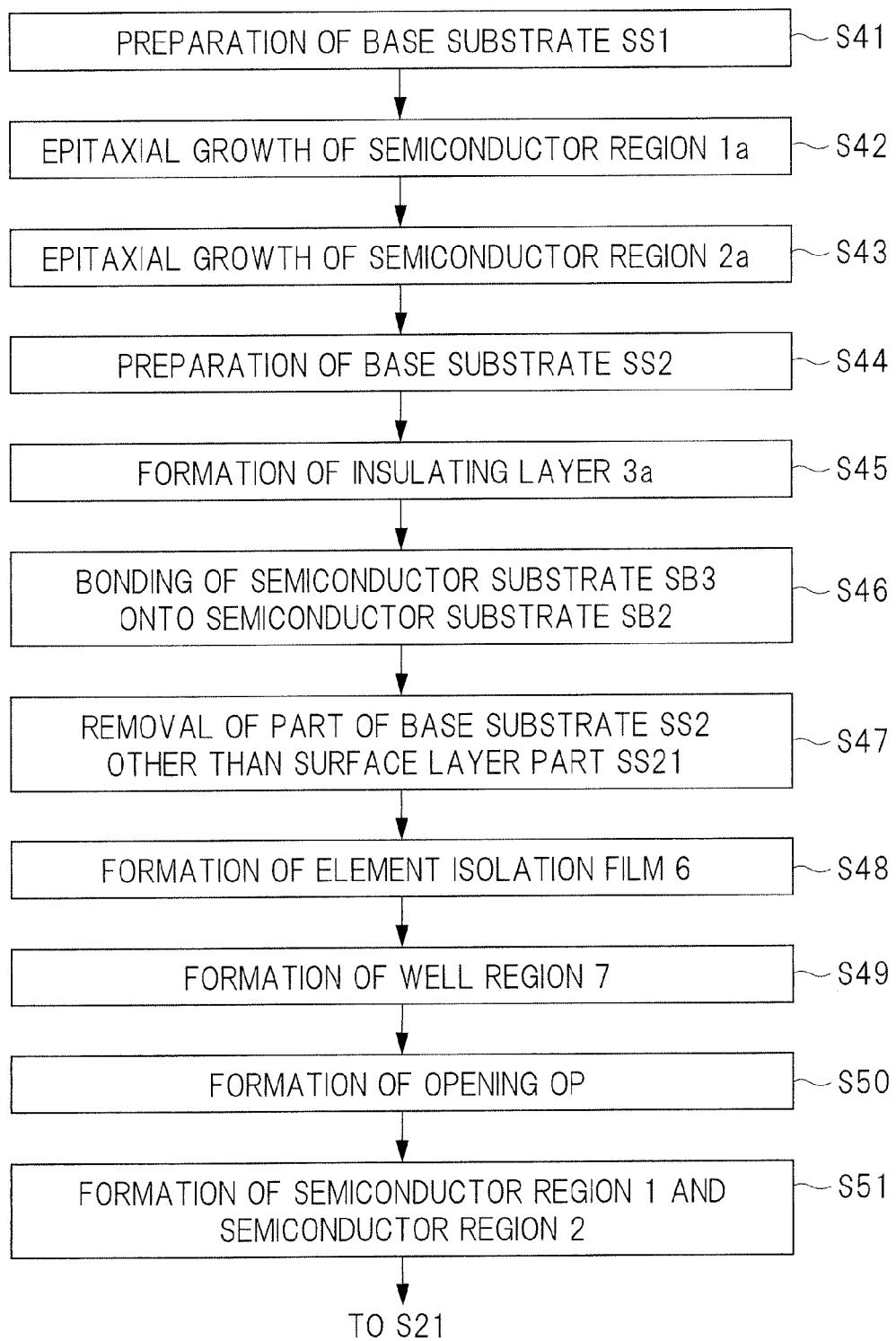
FIG. 31 is a process flow chart showing a part of a manufacturing process of the semiconductor device of the second embodiment.

Next, a manufacturing method of a semiconductor device of the second embodiment will be described. FIG. 31 is a process flowchart showing a part of the manufacturing process of the semiconductor device of the second embodiment. FIGS. 32 to 36 are cross-sectional views showing a principal part in the manufacturing process of the semiconductor device of the second embodiment.

Note that the process different from the manufacturing process of the semiconductor device of the first embodiment will be mainly described below.

At the beginning, the process of preparing the SOI substrate SB1 will be described with reference to FIG. 32 to FIG. 34.

Figure 32:
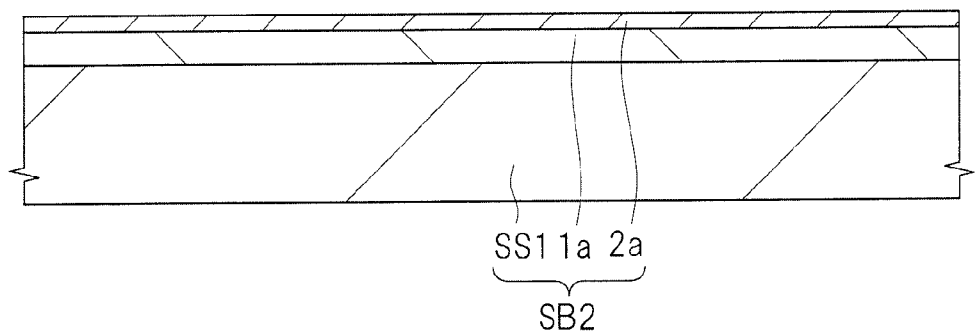
FIG. 32 is a cross-sectional view showing a principal part in the manufacturing process of the semiconductor device of the second embodiment.
Figure 33:
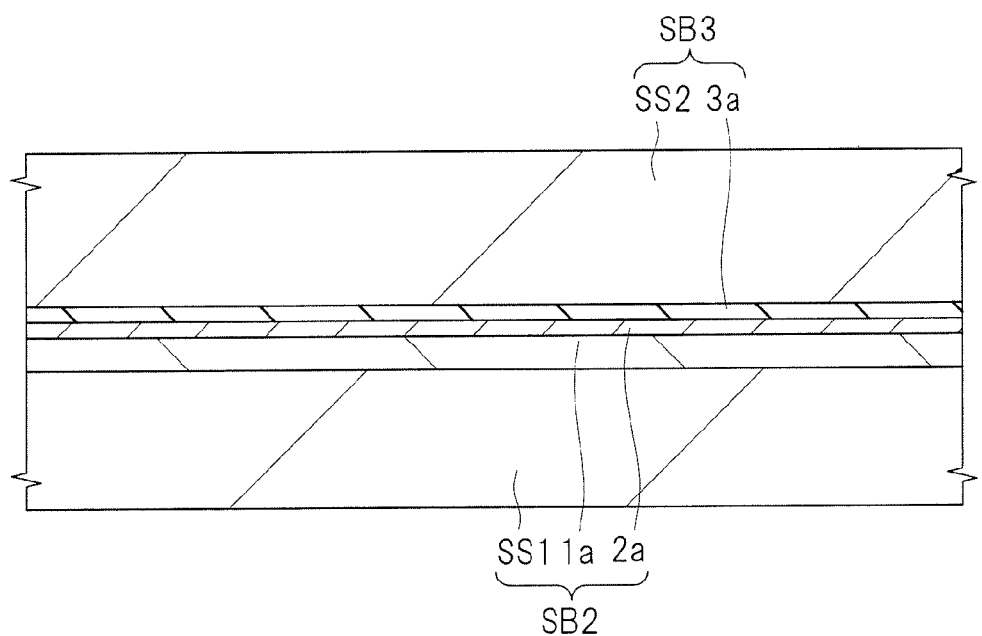
FIG. 33 is a cross-sectional view showing a principal part in the manufacturing process of the semiconductor device of the second embodiment.

First, as shown in FIG. 32, by performing the same process as the step S11 and the step S12 of FIG. 2 (step S41 and step S42 of FIG. 31), the semiconductor substrate SB2 is prepared. However, in the second embodiment, unlike the first embodiment, after performing the step S42, a semiconductor region 2a for the ground plane region made of, for example, an Si film is epitaxially grown by, for example, CVD on the semiconductor region 1a (step S43 of FIG. 31). In this manner, in the second embodiment, a semiconductor substrate SB2 made up of the base substrate SS1, the semiconductor region 1a and the semiconductor region 2a is prepared.

Next, by performing the same process as the step S13 and the step S14 of FIG. 2 (step S44 and step S45 of FIG. 31), a semiconductor substrate SB3 made up of the base substrate SS2 and the insulating layer 3a is prepared. Next, by performing the same process as the step S15 of FIG. 2 (step S46 of FIG. 31), the semiconductor substrate SB3 is bonded onto the semiconductor substrate SB2 as shown in FIG. 33. In this step S46, in the state where the insulating layer 3a faces the semiconductor region 2a, the semiconductor substrate SB3 and the semiconductor substrate SB2 are pressure-bonded so that the insulating layer 3a comes into contact with the semiconductor region 2a. Then, the semiconductor substrate SB3 and the semiconductor substrate SB2 are retained at a high temperature of, for example, 1000° C. and are subjected to a thermal treatment. In this manner, the semiconductor substrate SB3 is boned onto the semiconductor substrate SB2. At this time, the insulating layer 3a and the semiconductor region 2a are joined.

Figure 34:
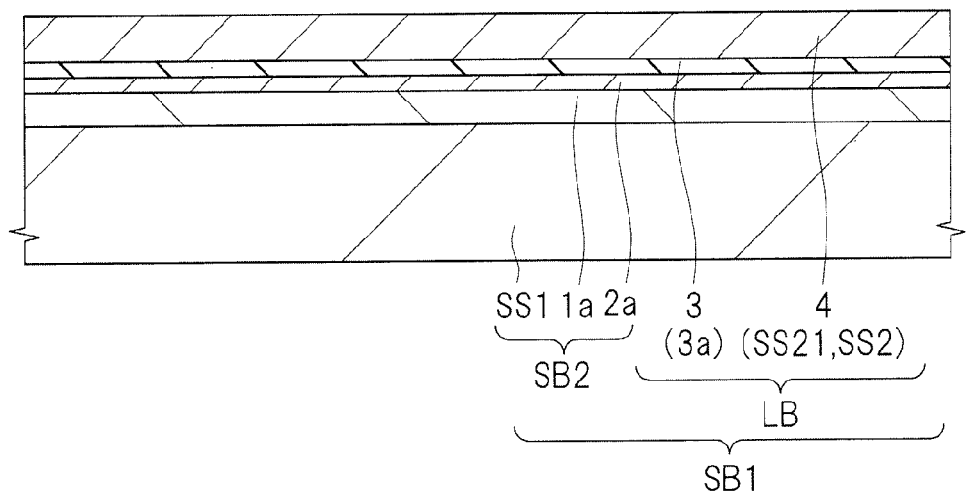
FIG. 34 is a cross-sectional view showing a principal part in the manufacturing process of the semiconductor device of the second embodiment.

Next, by performing the same process as the step S16 of FIG. 2 (step S47 of FIG. 31), as shown in FIG. 34, the base substrate SS2 of the semiconductor substrate SB3 bonded onto the semiconductor substrate SB2 is removed except the surface layer part SS21 on a side close to the semiconductor substrate SB2. Alternatively, in this step S47, another method such as the smart cut technology can be used like the first embodiment described above.

In this manner, a stacked body LB made up of the BOX layer 3 made of the insulating layer 3a and the SOI layer 4 as a semiconductor layer made of the surface layer part SS21 disposed on the BOX layer 3 is transferred onto the semiconductor region 2a, that is, onto the semiconductor substrate SB2. Thus, the SOI substrate SB1 including the base substrate SS1, the semiconductor region 1a formed on the base substrate SS1, the semiconductor region 2a formed on the semiconductor region 1a, the BOX layer 3 formed on the semiconductor region 1a via the semiconductor region 2a and the SOI layer 4 formed on the BOX layer 3 is prepared.

Next, a process of fabricating the MISFET Q1 on the SOI substrate SB1 will be described with reference to FIGS. 35 and 36.

Figure 35:
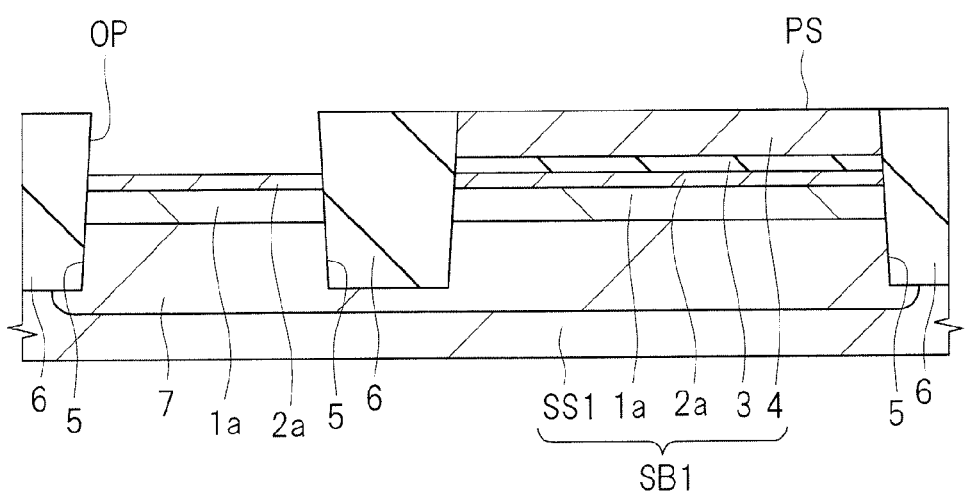
FIG. 35 is a cross-sectional view showing a principal part in the manufacturing process of the semiconductor device of the second embodiment.

First, by performing the same process as the step S17 to the step S19 of FIG. 2 (step S48 to step S50 of FIG. 31), the element isolation films 6, the well region 7 and the opening OP are formed as shown in FIG. 35.

Note that, like the first embodiment described above, the semiconductor region 1a and the semiconductor region 2a in the region AR2 and the region AR3 (see FIG. 1) may be removed when the opening OP is formed.

Figure 36:
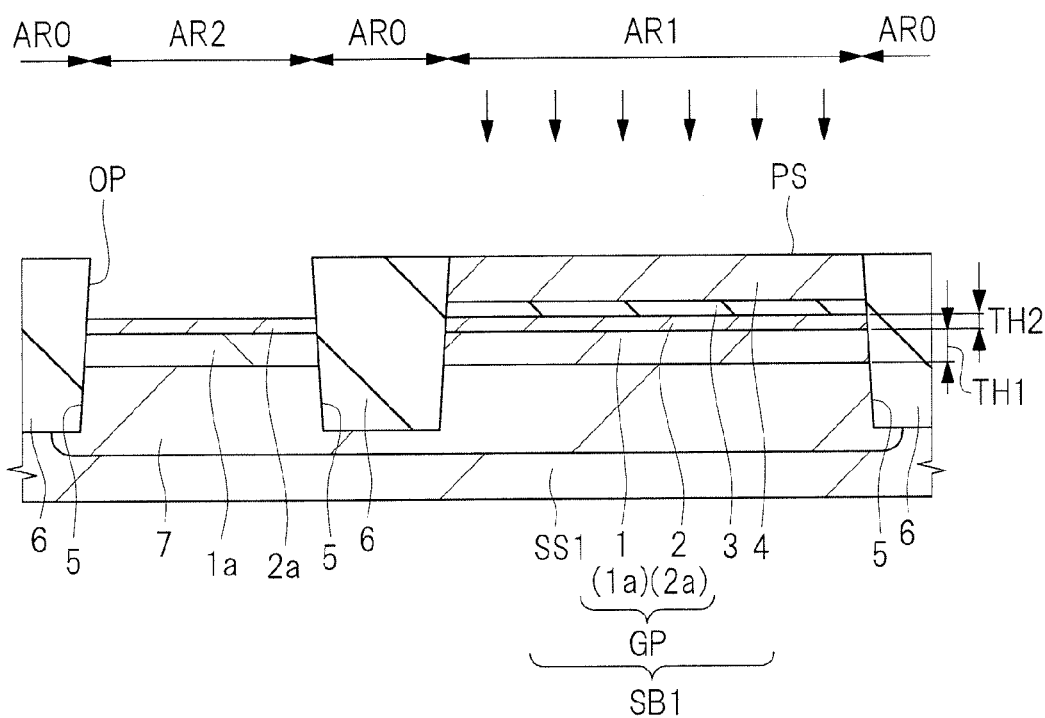
FIG. 36 is a cross-sectional view showing a principal part in the manufacturing process of the semiconductor device of the second embodiment.

Next, by performing the same process as the step S20 of FIG. 2 (step S51 of FIG. 31), the semiconductor region 1 and the semiconductor region 2 are formed as shown in FIG. 36. In this step S51, a p type impurity is introduced to the semiconductor region 1a and the semiconductor region 2a by ion implantation with using a resist film having an opening formed in the MISFET formation region AR1 as a mask. Thus, the semiconductor region 1 made of the semiconductor region 1a to which the p type impurity has been introduced is formed, and the semiconductor region 2 made of the semiconductor region 2a to which the p type impurity has been introduced is formed. In this manner, the ground plane region GP made up of the semiconductor region 1 and the semiconductor region 2 is formed.

A conductivity type of the impurity to be introduced to the semiconductor region 1a and the semiconductor region 2a is the same as the conductivity type of the well region 7 located below the semiconductor region 1a. Also, a p type impurity concentration in the semiconductor region 1 made of the semiconductor region 1a to which the p type impurity has been introduced is higher than the p type impurity concentration in the well region 7. Implantation conditions for the ion implantation are adjusted so that the semiconductor region 1 has the p type impurity concentration of, for example, about $1 \times 10^{18}$ to $2 \times 10^{19}$ cm$^{-3}$.

Also, in the step S51, after the impurity is ion-implanted into the semiconductor region 1a and the semiconductor region 2a, the thermal treatment for the SOI substrate SB1, that is, activation annealing can be performed at a temperature of, for example, about 1000° C. In this manner, the ion-implanted impurity can be activated in the semiconductor region 1 and the semiconductor region 2.

Thereafter, by performing the same process as the steps S21 to S30 of FIG. 3, the semiconductor device of the second embodiment is manufactured as shown in FIG. 30.

<Control of Threshold Voltage of MISFET>

Next, control of the threshold voltage of the MISFET in the semiconductor device of the second embodiment will be described in comparison with control of the threshold voltage of the MISFET in the semiconductor device of a comparative example 2 having the same structure as that of the comparative example 1 described in the first embodiment.

Figure 37:
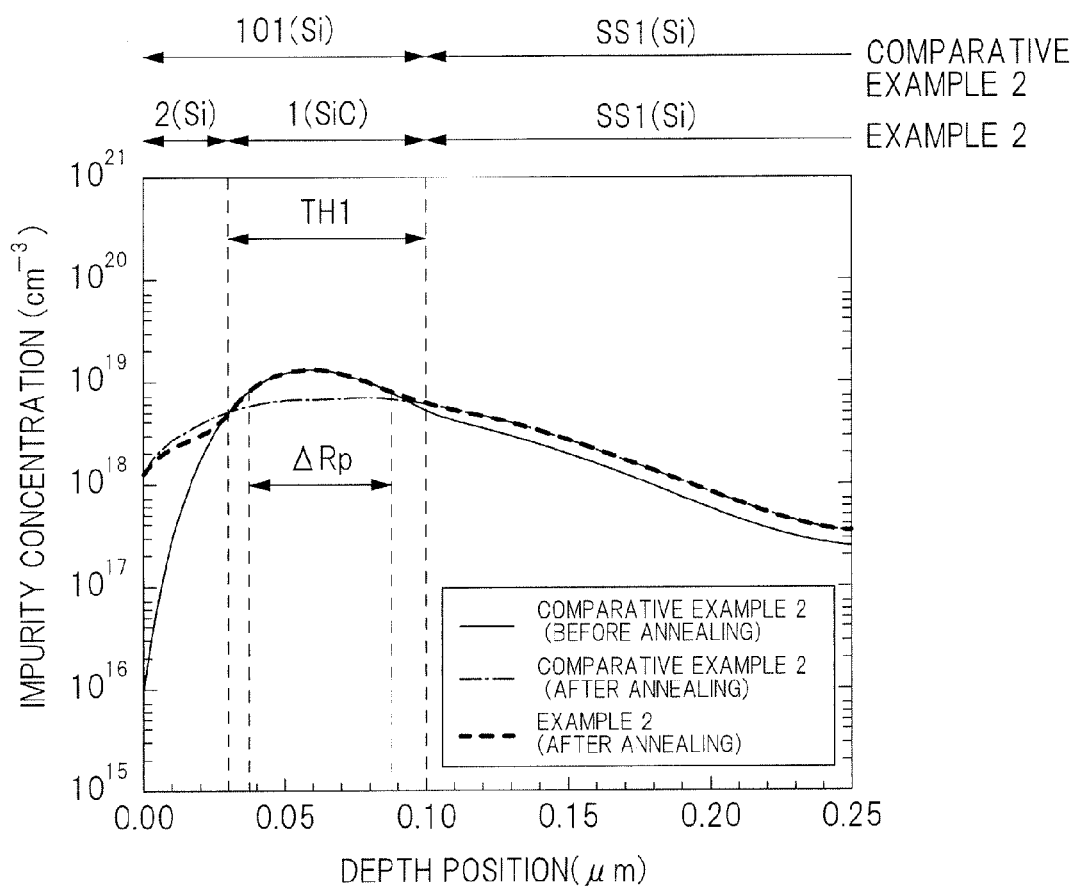
FIG. 37 is a graph showing an impurity concentration distribution in a thickness direction of an SOI substrate.

FIG. 37 is a graph showing an impurity concentration distribution in a thickness direction of an SOI substrate. In FIG. 37, the impurity concentration distributions of boron as a p type impurity in each of the semiconductor region 101 or the semiconductor region 1 and the semiconductor region 2 serving as the ground plane region GP and the base substrate SS1, that is, the well region 7 are obtained by calculation for the comparative example 2 and an example 2 as one example of the second embodiment. Note that the semiconductor region 1 is made of silicon carbide (SiC) and the semiconductor region 101, the semiconductor region 2 and the base substrate SS1 are made of silicon (Si).

The horizontal axis of FIG. 37 represents a depth position when a depth position of the upper surface of the ground plane region GP is defined as 0, and the vertical axis of FIG. 37 represents an impurity concentration of boron as a p type impurity. In FIG. 37, the concentration distribution after the ion implantation and before the activation annealing in the comparative example 2 is designated as "comparative example 2 (before annealing)", and the concentration distribution after the ion implantation and the activation annealing in the comparative example 2 is designated as "comparative example 2 (after annealing)". Also, the concentration distribution after the ion implantation and the activation annealing in the example 2 is designated as "example 2 (after annealing)". In addition, the concentration distribution after the ion implantation and before the activation annealing in the example 2 is assumed to be the same as the concentration distribution after the ion implantation and before the activation annealing in the comparative example 2.

Note that, in the calculation of the impurity concentration distribution in FIG. 37, the thermal treatment temperature of the activation annealing, the diffusion coefficient of boron in silicon the composition ratio of silicon carbide and the diffusion coefficient of boron in silicon carbide are set to the same values as those of the calculation of the impurity concentration distribution in FIG. 29.

In the comparative example 2, at the ion implantation before performing the activation annealing, the impurity concentration distribution in the depth direction, that is, in the thickness direction of the semiconductor region 101 has a peak between the upper surface of the semiconductor region 101 and the lower surface of the semiconductor region 101. Then, an impurity is ion-implanted so that the thickness of the semiconductor region 101 is larger than a half-value width of the peak. Further, as described above, also in the example 2, the impurity concentration distribution in the depth direction, that is, in the thickness direction of the semiconductor region 1 and the semiconductor region 2 before performing the activation annealing is the same as that of the comparative example 2.

Since the semiconductor region 101 is made of Si in the comparative example 2, when performing the activation annealing after the ion implantation, the ion-implanted impurity is easily diffused. Therefore, in the comparative example 2, after performing the activation annealing, the impurity concentration distribution in the depth direction, that is, in the thickness direction of the semiconductor region 101 still has a peak between the upper surface of the semiconductor region 101 and the lower surface of the semiconductor region 101, but the peak height in the impurity concentration distribution is lowered and the half-value width of the peak expands. As a result, in the comparative example 2, after performing the activation annealing, the average value of impurity concentration in the entire ground plane region GP decreases. Consequently, since the absolute value of the built-in potential Vbi of the ground plane region GP decreases as described with reference to the expression (1) above, the range capable of adjusting the threshold voltage Vth is narrowed and the performance of the semiconductor device is degraded.

On the other hand, in the example 2, since the semiconductor region 1 is made of SiC having an impurity diffusion coefficient smaller than an impurity diffusion coefficient of Si at the temperature of about 1000° C., when the activation annealing is performed after the ion implantation, the ion-implanted impurity is less likely to be diffused. Therefore, in the example 2, after performing the activation annealing, the impurity concentration distribution in the depth direction, that is, in the thickness direction of the semiconductor region 1 shows almost no change from the impurity concentration distribution before performing the activation annealing. In other words, in the example 2, since the impurity is less likely to be diffused when performing the activation annealing, the impurity concentration distribution just after the ion implantation is maintained even after performing the activation annealing.

More specifically, in the example 2, even after the activation annealing is performed, the impurity concentration distribution in the depth direction, that is, in the thickness direction of the semiconductor region 1 still has a peak between the upper surface of the semiconductor region 1 and the lower surface of the semiconductor region 1, and the thickness TH1 of the semiconductor region 1 is larger than a half-value width ΔRp of the peak. Alternatively, preferably, the impurity concentration distribution in the thickness direction of the semiconductor region 1 has a peak between the upper surface of the semiconductor region 1 and the lower surface of the semiconductor region 1, and both of the impurity concentration of the upper surface of the semiconductor region 1 and the impurity concentration of the lower surface of the semiconductor region 1 are lower than the half of the impurity concentration at the peak.

In this manner, since a part having at least the impurity concentration equal to or higher than ½ of the impurity concentration at the peak, that is, the peak value is included in the semiconductor region 1, the impurity concentration in the semiconductor region 1 can be reliably increased. Thus, it is possible to prevent or suppress the decrease of the average value of the impurity concentration in the entire ground plane region GP after the activation annealing is performed. Therefore, as described with reference to the expression (1) above, it is possible to prevent or suppress the decrease of the absolute value of the built-in potential Vbi, so that the range capable of adjusting the threshold voltage Vth can be expanded and the performance of the semiconductor device can be improved.

In addition, in the example 2, the semiconductor region 2 made of an Si film is provided between the semiconductor region 1 and the BOX layer 3. Thus, since the impurity from the semiconductor region 1 made of SiC is diffused into the semiconductor region 2 made of Si, the impurity concentration in the semiconductor region 2 which is a part of the ground plane region on a side close to the BOX layer 3 can be kept high while maintaining the impurity concentration distribution in the semiconductor region 1 made of SiC even after performing the activation annealing.

Preferably, the thickness TH2 of the semiconductor region 2 is smaller than the thickness TH1 of the semiconductor region 1. In this manner, the impurity concentration in the semiconductor region 2 can be increased while sufficiently securing the effect of maintaining the impurity concentration distribution in the semiconductor region 1 made of SiC after performing the activation annealing.

Note that, also in the example, 2, when the impurity concentration in the semiconductor region 1 is low, the resistance of the semiconductor region 1 becomes high like the example 1. Also, though not illustrated in FIG. 37, also in the example 2, when the activation annealing is performed, the impurity ion-implanted into the semiconductor region 1 and the semiconductor region 2 is less likely to be diffused to the side close to the BOX layer 3, so that the impurity concentration in a part of the ground plane region GP in contact with the BOX layer 3 is less likely to be increased like the example 1.

<Main Feature and Effect of Present Embodiment>

In the second embodiment, the semiconductor device includes the SOI substrate SB1 and the MISFET Q1 formed on the SOI substrate SB1 like the first embodiment. The SOI substrate SB1 has the base substrate SS1, the ground plane region GP formed on the base substrate SS1, the BOX layer 3 formed on the ground plane region GP and the SOI layer 4 formed on the BOX layer 3. The base substrate SS1 is made of Si and the ground plane region GP includes the p type semiconductor region 1 made of SiC. Thus, the semiconductor device of the second embodiment can achieve the same effects as those of the semiconductor device of the first embodiment.

Meanwhile, in the second embodiment, the ground plane region GP includes the p type semiconductor region 1 made of SiC as well as the p type semiconductor region 2 made of Si formed on the p type semiconductor region 1 made of SiC unlike the first embodiment.

Thus, since the impurity in the semiconductor region 1 made of SiC is diffused into the semiconductor region 2 made of Si, the impurity concentration in the semiconductor region 2 which is a part of the ground plane region GP on a side close to the BOX layer 3 can be increased while maintaining the impurity concentration distribution in the semiconductor region 1 made of SiC even after performing the activation annealing.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device, comprising:
a semiconductor substrate; and
first and second field effect transistors,
wherein the semiconductor substrate has:
a first base substrate including a first region and a second region;
a first semiconductor region of a first conductivity type formed on the first region of the first base substrate or in an upper layer part of the first region of the first base substrate;
an insulating layer formed on the first semiconductor region; and
a semiconductor layer formed on the insulating layer,
wherein the first base substrate is made of silicon,
wherein the first semiconductor region is made of silicon carbide,
wherein the first field effect transistor is formed on the semiconductor layer,
wherein the semiconductor layer, the insulating layer, and the first semiconductor region are removed from the second region, and
wherein the second field effect transistor is formed on the second region of the first base substrate.

2. The semiconductor device according to claim 1,
wherein the first semiconductor region is epitaxially grown on the first base substrate.

3. The semiconductor device according to claim 1,
wherein a first impurity of the first conductivity type is introduced to the first semiconductor region,
a concentration distribution of the first impurity in a thickness direction of the first semiconductor region has a peak between an upper surface of the first semiconductor region and a lower surface of the first semiconductor region, and
both of a concentration of the first impurity of the upper surface of the first semiconductor region and a concentration of the first impurity of the lower surface of the first semiconductor region are lower than a half of a concentration of the first impurity at the peak.

4. The semiconductor device according to claim 1,
wherein the first field effect transistor has:
a first gate electrode formed on the semiconductor layer via a first gate insulating film;
a second semiconductor region of a second conductivity type opposite to the first conductivity type formed in a part of the semiconductor layer located on a first side of the first gate electrode; and
a third semiconductor region of the second conductivity type formed in a part of the semiconductor layer located on a side opposite to the first side of the first gate electrode, and
wherein the second field effect transistor has:
a second gate electrode formed on the second region of the first base substrate via a second gate insulating film;
a fourth semiconductor region of the second conductivity type formed in a part of the second region of the first base substrate located on a first side of the second gate electrode; and
a fifth semiconductor region of the second conductivity type formed in a part of the second region of the first base substrate located on a side opposite to the first side of the second gate electrode.

5. The semiconductor device according to claim 4,
wherein a second impurity of the first conductivity type is introduced to the first semiconductor region,
the first conductivity type is a p type,
the second conductivity type is an n type, and
the second impurity is made of boron.

6. The semiconductor device according to claim 1,
wherein the semiconductor substrate has a fourth semiconductor region formed on the first semiconductor region,
the insulating layer is formed on the first semiconductor region via the fourth semiconductor region, and
the fourth semiconductor region is made of silicon.

7. A manufacturing method of a semiconductor device, comprising:
(a) preparing a first semiconductor substrate;
(b) forming a first field effect transistor; and
(c) forming a second field effect transistor,
wherein the first semiconductor substrate prepared in (a) has:
a first base substrate including a first region and a second region,
a first semiconductor region formed on the first base substrate or in an upper layer part of the first base substrate,
an insulating layer formed on the first semiconductor region, and
a semiconductor layer formed on the insulating layer,
wherein, in (b), a first impurity of a first conductivity type is introduced to the first semiconductor region formed on the first region of the first base substrate,
wherein, in (c), respective portions of the semiconductor layer, the insulating layer, and the first semiconductor region that were formed on the second region of the first base substrate are removed therefrom,
wherein the first field effect transistor is formed on the semiconductor layer,
wherein the second field effect transistor is formed on the second region of the first base substrate,
wherein the first base substrate is made of silicon, and
wherein the first semiconductor region is made of silicon carbide.

8. The manufacturing method of a semiconductor device according to claim 7,
wherein (a) includes:
(a1) epitaxially growing the first semiconductor region on the first base substrate; and
(a2) transferring a stacked body made up of the insulating layer and the semiconductor layer disposed on the insulating layer onto the first semiconductor region.

9. The manufacturing method of a semiconductor device according to claim 7,
wherein a concentration distribution of the first impurity introduced in (b) in a thickness direction of the first semiconductor region has a peak between an upper surface of the first semiconductor region and a lower surface of the first semiconductor region, and
both of a concentration of the first impurity of the upper surface of the first semiconductor region and a concentration of the first impurity of the lower surface of the first semiconductor region are lower than a half of a concentration of the first impurity at the peak.

10. The manufacturing method of a semiconductor device according to claim 7,
wherein (b) includes:
(b1) forming a first gate electrode on the semiconductor layer via a first gate insulating film; and
(b2) forming a second semiconductor region of a second conductivity type opposite to the first conductivity type in a part of the semiconductor layer located on a first side of the first gate electrode and forming a third semiconductor region of the second conductivity type in a part of the semiconductor layer located on a side opposite to the first side of the first gate electrode, and
wherein (c) includes:
(c1) forming a second gate electrode on the second region of the first base substrate via a second gate insulating film; and
(c2) forming a fourth semiconductor region of the second conductivity type in a part of the second region of the first base substrate located on a first side of the second gate electrode, and forming a fifth semiconductor region of the second conductivity type in a part of the second region of the first base substrate located on a side opposite to the first side of the second gate electrode.

11. The manufacturing method of a semiconductor device according to claim 10,
wherein the first conductivity type is a p type,
the second conductivity type is an n type, and
the first impurity is made of boron.

12. The manufacturing method of a semiconductor device according to claim 7,
wherein (b) includes:
(b3) ion-implanting the first impurity into the first semiconductor region.

13. The manufacturing method of a semiconductor device according to claim 12,
wherein (b) includes:
(b4) performing a thermal treatment to the first semiconductor substrate at a first temperature after (b3), and
the first temperature is 800° C. or higher.

14. The manufacturing method of a semiconductor device according to claim 7,
wherein, in (a), the first semiconductor substrate having a fourth semiconductor region formed on the first semiconductor region and the insulating layer formed on the first semiconductor region via the fourth semiconductor region is prepared, and
the fourth semiconductor region is made of silicon.

15. The manufacturing method of a semiconductor device according to claim 8,
wherein, in (a1), a second semiconductor substrate made up of the first base substrate and the first semiconductor region is prepared, and
wherein (a2) includes:
(a3) preparing a third semiconductor substrate made up of a second base substrate made of a semiconductor and the insulating layer formed on the second base substrate;
(a4) bonding the third semiconductor substrate onto the second semiconductor substrate in a state where the insulating layer faces the first semiconductor region after (a1) and (a3); and
(a5) leaving the insulating layer and a surface layer part of the second base substrate on a side close to the second semiconductor substrate on the second semiconductor substrate and removing the second base substrate other than the surface layer part from the second semiconductor substrate after (a4).

16. The semiconductor device of claim 4,
wherein the first field effect transistor has a first semiconductor film on the second semiconductor region and a second semiconductor film on the third semiconductor region,
wherein the first and second semiconductor films have the second conductivity type,
wherein an impurity concentration of the first semiconductor film is greater than that of the second semiconductor region, and
wherein an impurity concentration of the second semiconductor film is greater than that of the third semiconductor region.

17. The semiconductor device of claim 1,
wherein the first base substrate further includes a third region between the first and second regions in plan view,
wherein the first, second, and third regions are separated from each other by trenches extending into the first base substrate and filled with insulating material, and
wherein a contact for applying a voltage bias to the first semiconductor region is formed on the third region.

18. The semiconductor device of claim 17, wherein the semiconductor layer, the insulating layer, and the first semiconductor region are also removed from the third region.

19. The semiconductor device of claim 17, further comprising a well region of the first conductivity type formed in the first base substrate and extending between the first and third regions to electrically connect the contact with the first semiconductor region.

* * * * *